US012744069B2

(12) United States Patent
Sakai et al.

(10) Patent No.: US 12,744,069 B2
(45) Date of Patent: Sep. 22, 2026

(54) ELECTRONIC DEVICE WITH MEMORY TO WRITE WITH AND WITHOUT VERIFICATION

(71) Applicant: SONY SEMICONDUCTOR SOLUTIONS CORPORATION, Kanagawa (JP)

(72) Inventors: Lui Sakai, Kanagawa (JP); Masanori Hosomi, Kanagawa (JP); Keizo Hiraga, Kanagawa (JP); Yutaka Higo, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 155 days.

(21) Appl. No.: 18/710,758

(22) PCT Filed: Nov. 15, 2022

(86) PCT No.: PCT/JP2022/042328
§ 371 (c)(1),
(2) Date: May 16, 2024

(87) PCT Pub. No.: WO2023/095668
PCT Pub. Date: Jun. 1, 2023

(65) Prior Publication Data

US 2025/0046357 A1 Feb. 6, 2025

(30) Foreign Application Priority Data

Nov. 25, 2021 (JP) ................................ 2021-191297

(51) Int. Cl.
*G11C 11/16* (2006.01)
*G11C 29/52* (2006.01)

(52) U.S. Cl.
CPC ...... *G11C 11/1675* (2013.01); *G11C 11/1653* (2013.01); *G11C 11/1673* (2013.01);
(Continued)

(58) Field of Classification Search
CPC ............ G11C 11/1675; G11C 11/1653; G11C 11/1673; G11C 11/1677; G11C 11/161;
(Continued)

(56) References Cited

U.S. PATENT DOCUMENTS 9,432,298 B1 * 8/2016 Smith .................... H04L 47/34
2008/0082644 A1 * 4/2008 Isard .................. H04L 67/1097
709/223

(Continued)

FOREIGN PATENT DOCUMENTS

JP 2018-049672 A 3/2018
JP 2019-021356 A 2/2019

(Continued)

OTHER PUBLICATIONS

International Search Report and Written Opinion of PCT Application No. PCT/JP2022/042328, issued on Jan. 17, 2023, 09 pages of ISRWO.

*Primary Examiner* — Sultana Begum
(74) *Attorney, Agent, or Firm* — CHIP LAW GROUP

(57) ABSTRACT

A configuration of an electronic device is to be simplified. The electronic device includes a magnetoresistive effect memory, a memory control unit, and a processing unit. The magnetoresistive effect memory holds first data to be written with verification and second data to be written without verification. The memory control unit writes the first data and the second data into the magnetoresistive effect memory and verifies the first data. The processing unit performs processing based on the first data and the second data.

13 Claims, 25 Drawing Sheets

(52) U.S. Cl.
CPC .......... *G11C 11/1677* (2013.01); *G11C 29/52* (2013.01); *G11C 11/161* (2013.01)

(58) Field of Classification Search
CPC ......... G11C 11/16; G11C 29/52; G06F 11/10; G06F 11/1048; G06F 12/06
See application file for complete search history.

(56) References Cited

U.S. PATENT DOCUMENTS

| | | | | |
|---|---|---|---|---|
| 2012/0236174 | A1* | 9/2012 | Kinrot | H04N 23/745 348/241 |
| 2020/0211663 | A1* | 7/2020 | Baraskar | G11C 16/3459 |
| 2020/0372403 | A1* | 11/2020 | Kursun | H04L 41/16 |
| 2021/0314205 | A1* | 10/2021 | Chen | H04W 28/06 |

FOREIGN PATENT DOCUMENTS

| | | | |
|---|---|---|---|
| JP | 2019-062183 | A | 4/2019 |
| TW | 201505221 | A | 2/2015 |
| WO | 2015/174020 | A1 | 11/2015 |

* cited by examiner

FIG. 1

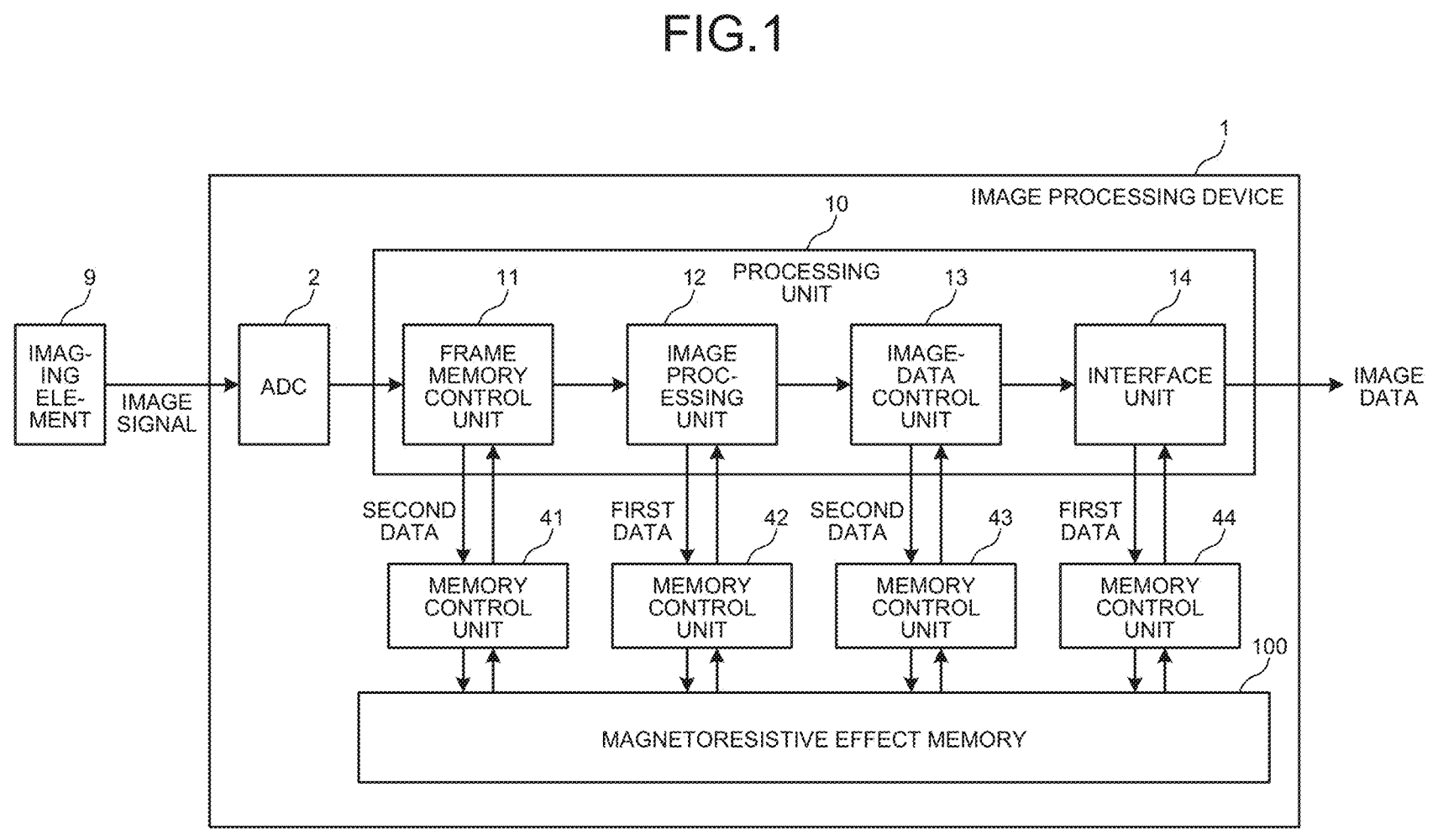

1 IMAGE PROCESSING DEVICE

9 IMAGING ELEMENT

IMAGE SIGNAL

2 ADC

10 PROCESSING UNIT

11 FRAME MEMORY CONTROL UNIT

12 IMAGE PROCESSING UNIT

13 IMAGE-DATA CONTROL UNIT

14 INTERFACE UNIT

IMAGE DATA

SECOND DATA

FIRST DATA

SECOND DATA

FIRST DATA

41 MEMORY CONTROL UNIT

42 MEMORY CONTROL UNIT

43 MEMORY CONTROL UNIT

44 MEMORY CONTROL UNIT

100 MAGNETORESISTIVE EFFECT MEMORY

FIG.4

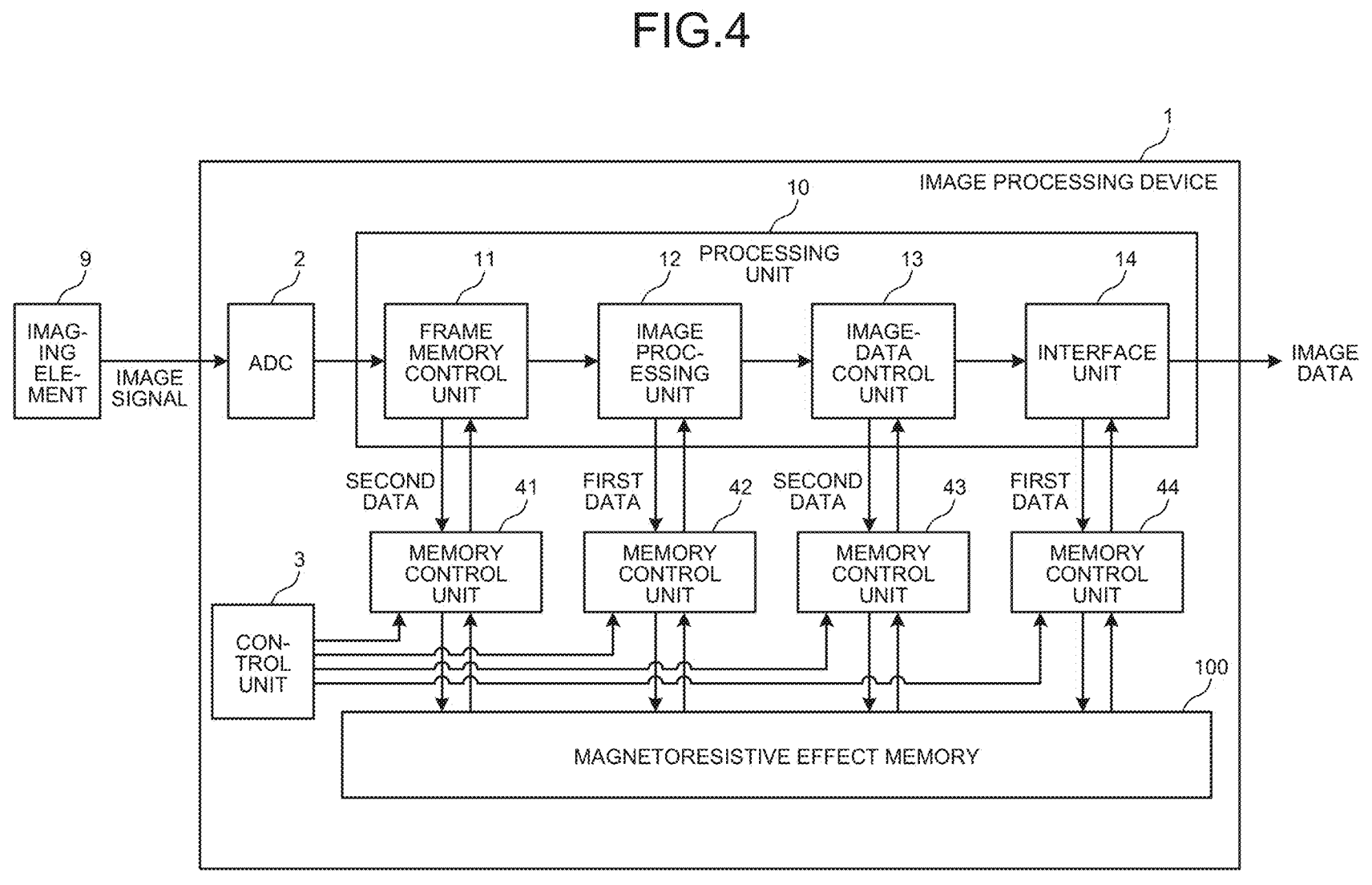

IMAGE PROCESSING DEVICE
1
9
IMAG-ING ELE-MENT
IMAGE SIGNAL
2
ADC
10
PROCESSING UNIT
11
FRAME MEMORY CONTROL UNIT
12
IMAGE PROC-ESSING UNIT
13
IMAGE-DATA CONTROL UNIT
14
INTERFACE UNIT
IMAGE DATA
SECOND DATA
FIRST DATA
SECOND DATA
FIRST DATA
41
MEMORY CONTROL UNIT
42
MEMORY CONTROL UNIT
43
MEMORY CONTROL UNIT
44
MEMORY CONTROL UNIT
3
CON-TROL UNIT
100
MAGNETORESISTIVE EFFECT MEMORY

IMAGE DATA
1
IMAGE PROCESSING DEVICE
14
INTERFACE UNIT
10
12 PROCESSING UNIT
IMAGE PROC-ESSING UNIT
43
MEMORY CONTROL UNIT
42
MEMORY CONTROL UNIT
41
MEMORY CONTROL UNIT
SECOND DATA
FIRST DATA
SECOND DATA
MAGNETO-RESISTIVE EF-FECT MEMORY
102
MAGNETO-RESISTIVE EF-FECT MEMORY
100
MAGNETO-RESISTIVE EF-FECT MEMORY
101
2
ADC
3
CON-TROL UNIT
9
IMAG-ING ELE-MENT
IMAGE SIGNAL

ELECTRONIC DEVICE WITH MEMORY TO WRITE WITH AND WITHOUT VERIFICATION

CROSS REFERENCE TO RELATED APPLICATIONS

This application is a U.S. National Phase of International Patent Application No. PCT/JP2022/042328 filed on Nov. 15, 2022, which claims priority benefit of Japanese Patent Application No. JP 2021-191297 filed in the Japan Patent Office on Nov. 25, 2021. Each of the above-referenced applications is hereby incorporated herein by reference in its entirety.

FIELD

The present disclosure relates to an electronic device.

BACKGROUND

An electronic device configured by combining a memory device that holds data and a processing circuit that processes data is used. For example, there is proposed an electronic device (image sensor) configured by laminating a semiconductor chip on which a sensor array including pixels for generating an image signal of a subject is disposed and a semiconductor chip on which a memory and a processing circuit are disposed (see, for example, Patent Literature 1). As the memory of this image sensor, a dynamic random access memory (DRAM), a static random access memory (SRAM), a spin transfer torque MRAM (STT-MRAM), and a flash memory can be used.

CITATION LIST

Patent Literature

Patent Literature 1: JP 2019-062183 A

SUMMARY

Technical Problem

However, the above-described conventional technique has a problem that the configuration of an electronic device becomes complicated when a plurality of memories is mounted according to the application.

Therefore, the present disclosure proposes an electronic device with a simplified configuration.

Solution to Problem

An electronic device according to the present disclosure includes: a magnetoresistive effect memory configured to hold first data to be written for long-term holding and second data to be written for short-term holding; a memory control unit configured to write the first data and the second data into the magnetoresistive effect memory and to verify the first data; and a processing unit configured to perform processing based on the first data and the second data.

BRIEF DESCRIPTION OF DRAWINGS

FIG. 1 is a diagram illustrating a configuration example of an image processing device according to a first embodiment of the present disclosure.

FIG. 4 is a diagram illustrating another configuration example of the image processing device according to the first embodiment of the present disclosure.

DESCRIPTION OF EMBODIMENTS

Figure 2:
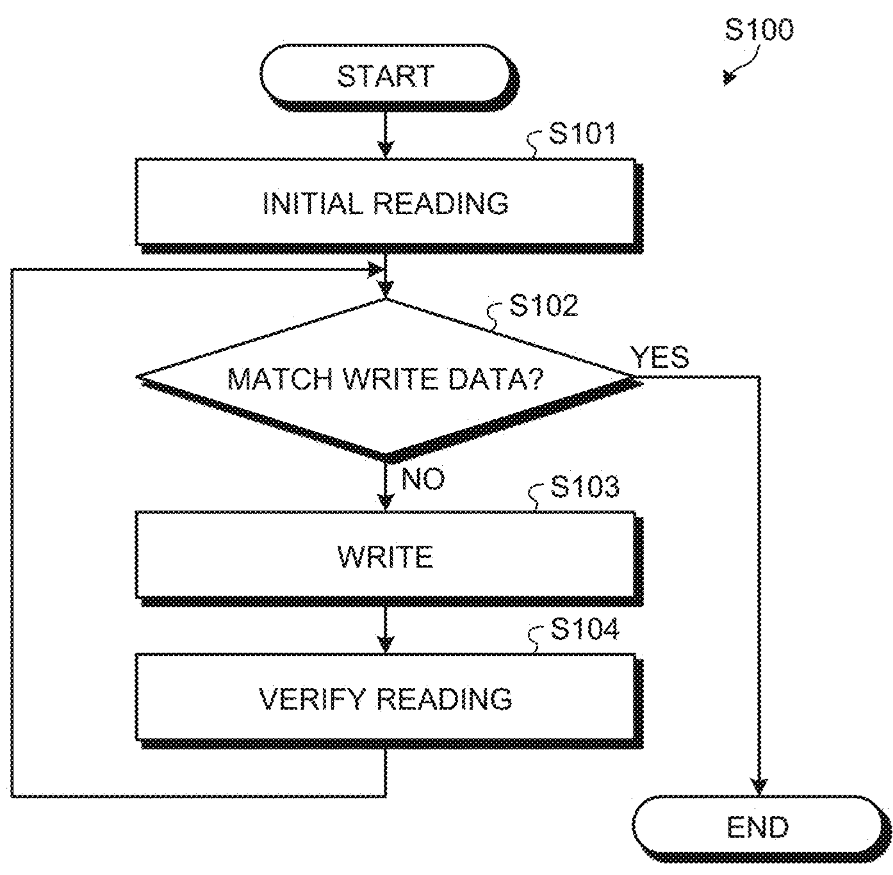
FIG. 2 is a diagram illustrating an example of a processing procedure of write processing according to the first embodiment of the present disclosure.

Hereinafter, embodiments of the present disclosure will be described in detail with reference to the drawings. The description will be given in the following order. In each of the following embodiments, the same parts are denoted by the same reference signs, and redundant description will be omitted.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment

1. First Embodiment

[Configuration of Image Processing Device]

FIG. 1 is a diagram illustrating a configuration example of an image processing device according to a first embodiment of the present disclosure. The drawing is a block diagram illustrating a configuration example of an image processing device 1. The image processing device 1 is an electronic device that processes an image signal generated by an imaging element 9 to generate image data. The image processing device 1 includes an analog-to-digital converter (ADC) 2, a processing unit 10, memory control units 41 to 44, and a magnetoresistive effect memory 100.

The ADC 2 performs analog-digital conversion of an image signal output from the imaging element 9 to generate a digital image signal.

The processing unit 10 processes data. The processing unit 10 in the drawing processes an image signal and image data output from the ADC 2. Here, the image data is assumed to be a frame that is a pixel signal for one screen. The processing unit 10 causes data, such as an image signal to be processed and setting information on processing, to be held in the magnetoresistive effect memory 100, which is described later. At this time, the processing unit 10 writes the data into the magnetoresistive effect memory 100 to hold the data.

The data to be written includes first data and second data. The first data is data to be written for long-term holding at the time of a write into the magnetoresistive effect memory 100. To this write for long-term holding, a method of verifying written data can be applied, for example. This is to reduce the write error rate. The first data corresponds to data of high importance in addition to data to be held for a long period of time. On the other hand, the second data is data to be written for short-term holding. To this write for short-term holding, a method of reducing a write delay by omitting verification of written data can be applied, for example. The second data corresponds to data to be written at a high speed in addition to data to be temporarily stored (held). Note that the first data may be applied to nonvolatile data, and the second data may be applied to volatile data. In addition, as the write for long-term holding, there is also a method of writing at a voltage higher than that for the write for short-term holding, in addition to the above write with verification.

The processing unit 10 includes a frame memory control unit 11, an image processing unit 12, an image-data control unit 13, and an interface unit 14.

The frame memory control unit 11 controls accumulation of image signals output from the imaging element 9 to configure a frame. The frame can be configured by writing image signals output in time series from the imaging element 9 into the magnetoresistive effect memory 100. The image signals at this time corresponds to the second data. The frame memory control unit 11 reads the configured frame from the magnetoresistive effect memory 100 and outputs the frame to the image processing unit 12.

The image processing unit 12 performs image processing of the frame. This image processing corresponds to, for example, correction of an image signal or the like. At this time, the image processing unit 12 reads a set value for the processing from the magnetoresistive effect memory 100. The set value corresponds to the first data. Note that the set value is input from an external memory device, for example, at the start of the image processing device 1 or the like and is written into the magnetoresistive effect memory 100. In addition, a program for the image processing in the image processing unit 12 can also be held in the magnetoresistive effect memory 100. This program is read from the magnetoresistive effect memory 100 and held in the image processing unit 12 at the start of the image processing device 1.

The image-data control unit 13 causes the frame after the image processing to be held in the magnetoresistive effect memory 100. The image-data control unit 13 writes the frame after the image processing into the magnetoresistive effect memory 100 to hold the frame in the magnetoresistive effect memory 100. In addition, the image-data control unit 13 reads the frame from the magnetoresistive effect memory 100 and outputs the frame to the interface unit 14. This frame corresponds to the second data.

The interface unit 14 communicates with an external device. The interface unit 14 outputs the frame after the image processing to the external device as image data. Note that the interface unit 14 performs calibration for measuring characteristics such as impedance of a transmission line connected to the external device. The interface unit 14 writes and holds the calibration result as a set value in the magnetoresistive effect memory 100. The set value based on the calibration result corresponds to the first data. The set value held in the magnetoresistive effect memory 100 is read from the magnetoresistive effect memory 100 by the interface unit 14 at the start of the image processing device 1 or the like.

The magnetoresistive effect memory 100 is a memory that uses a magnetoresistive effect element, such as a magnetic tunnel junction (MTJ) element having a voltage-controlled magnetic anisotropy (VCMA) effect, as a memory cell. This MTJ element is an element in which a nonmagnetic insulating layer is disposed between two ferromagnetic layers and is an element in which the resistance value changes depending on the magnetization directions of the two ferromagnetic layers. The MTJ element is in a high resistance state when the magnetization directions of the two ferromagnetic layers are different, and is in a low resistance state when the magnetization directions are the same. The magnetization directions can be changed by applying a write voltage to the MTJ element. The low resistance state and the high resistance state of the MTJ element can store 1-bit data by associating the values "0" and "1", respectively.

The magnetoresistive effect memory 100 is a memory that is small in size, has non-volatility, and is capable of high-speed writing. Non-volatility allows data to be held for a long period of time. Furthermore, since the magnetoresistive effect memory 100 has lower write energy than a STT-MRAM, the magnetoresistive effect memory 100 is also applicable to an application as an SRAM. As described above, the magnetoresistive effect memory 100 has more excellent characteristics than other types of memories in terms of occupied region and power consumption. In addition, the magnetoresistive effect memory 100 can hold data having different characteristics such as non-volatility. The magnetoresistive effect memory 100 in the drawing holds the above-described first data and second data.

The memory control units 41 to 44 control writing and reading of data into and from the magnetoresistive effect memory 100. The memory control unit 41 handles the data of the frame memory control unit 11, the memory control unit 42 handles the data of the image processing unit 12, the memory control unit 43 handles the data of the image-data control unit 13, and the memory control unit 44 handles the data of the interface unit 14. In addition, the memory control units 42 and 44 control writing and reading of the first data. In addition, the memory control units 42 and 44 further perform verification at the time of writing the first data. The memory control units 41 and 43 control writing and reading of the second data. Unlike the memory control units 42 and 44, the memory control units 41 and 43 do not perform verification at the time of writing.

[Write Processing]

FIG. 2 is a diagram illustrating an example of a processing procedure of write processing according to the first embodiment of the present disclosure. The drawing is a flowchart illustrating an example of write processing when the first data is written. The processing in the drawing is performed by the memory control units 42 and 44, which are responsible for writing the first data. The memory control unit 42 is described as an example. First, the memory control unit 42 performs initial reading (step S101). This can be performed by the memory control unit 42 reading data held in a write target memory cell. Next, the memory control unit 42 determines whether the data read in step S101 matches the write data (step S102). As the result, when they are matched (step S102, Yes), the write processing is terminated.

On the other hand, when they are not matched (step S102, No), the memory control unit 42 performs the write (step S103). Next, the memory control unit 42 performs verify reading (step S104). This can be performed by the memory control unit 42 reading data from the target memory cell. Thereafter, the memory control unit 42 proceeds to the processing in step S102, and determines whether the read data matches the write data (step S102). The determination as to whether the data read in step S104 matches the write data corresponds to the write verification processing.

Figure 3:
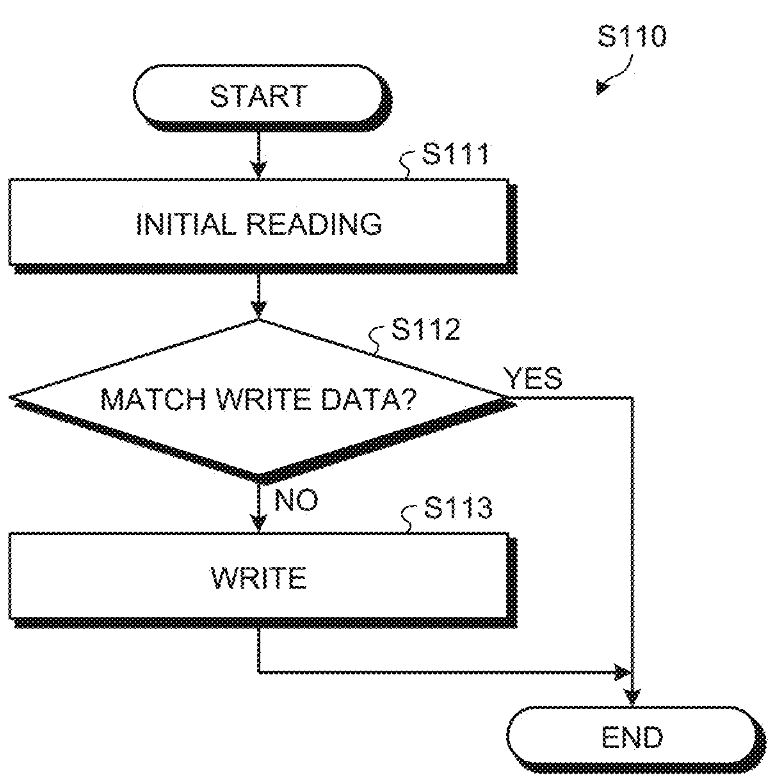
FIG. 3 is a diagram illustrating an example of a processing procedure of the write processing according to the first embodiment of the present disclosure.

FIG. 3 is a diagram illustrating an example of a processing procedure of write processing according to the first embodiment of the present disclosure. The drawing is a flowchart illustrating an example of write processing when the second data is written. The processing in the drawing is performed by the memory control units 41 and 43, which are responsible for writing the second data. The memory control unit 41 is described as an example. First, the memory control unit 41 performs initial reading (step S111). Next, the memory control unit 41 determines whether the data read in step S111 matches the write data (step S112). As the result, when they are matched (step S112, Yes), the write processing is terminated. On the other hand, when they are not matched (step S102, No), the memory control unit 42 performs the write (step S113).

[Another Configuration of Image Processing Device]

FIG. 4 is a diagram illustrating another configuration example of the image processing device according to the first embodiment of the present disclosure. The image processing device 1 in the drawing is different from the image processing device 1 in FIG. 1 in further including a control unit 3. Note that the memory control units 41 to 44 in the drawing can perform a write of both the first data and the second data.

The control unit 3 controls the write by the memory control units 41 to 44. The control unit 3 outputs a control signal to control the write of either the first data or the second data by the memory control units 41 to 44. The control unit 3 in the drawing performs control in such a manner that the memory control units 41 and 43 handle the second data and the memory control units 42 and 44 handle the first data.

[Write Processing]

Figure 5:
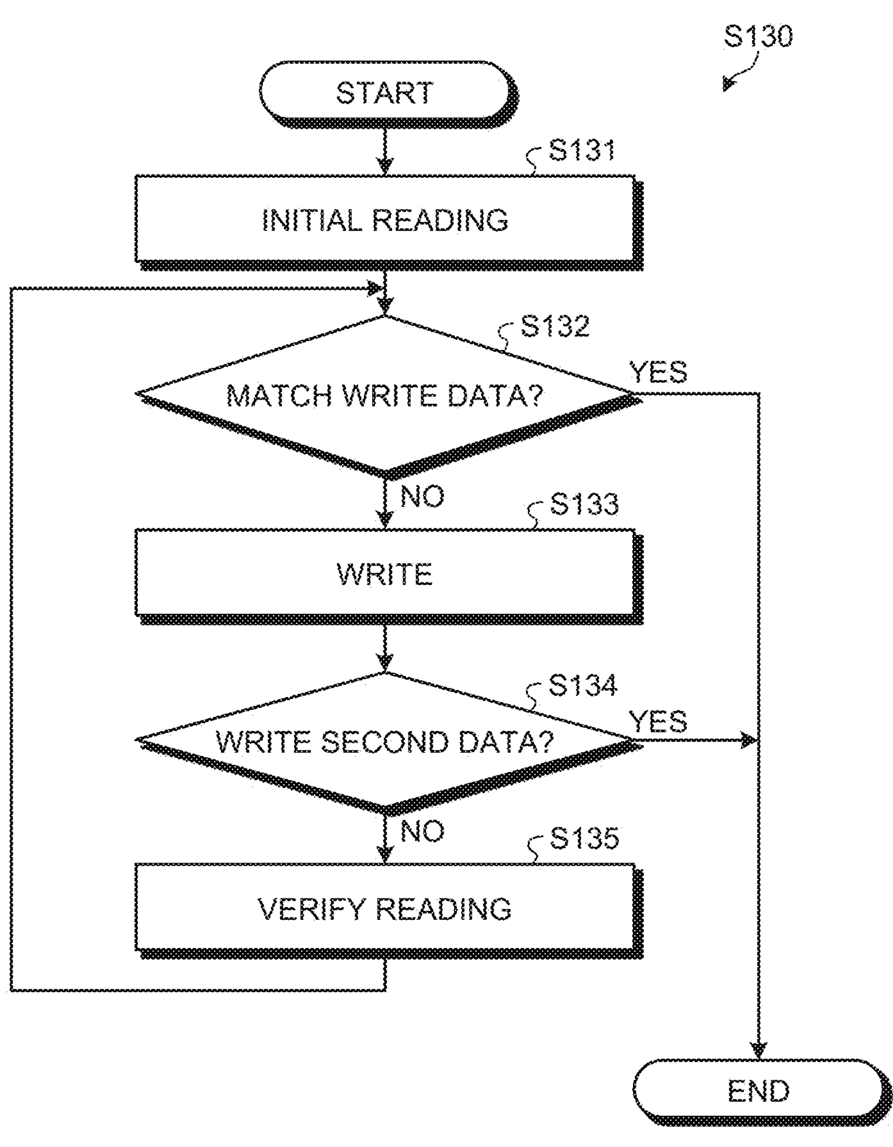
FIG. 5 is a diagram illustrating another example of the processing procedure of the write processing according to the first embodiment of the present disclosure.

FIG. 5 is a diagram illustrating another example of the processing procedure of the write processing according to the first embodiment of the present disclosure. The drawing illustrates processing performed by the memory control units 41 to 44 in FIG. 4. The memory control unit 41 is described as an example. First, the memory control unit 41 performs initial reading (step S131). Next, the memory control unit 41 determines whether the data read in step S131 matches the write data (step S132). As the result, when they are matched (step S132, Yes), the write processing is terminated, and when they are not matched (step S132, No), the memory control unit 41 performs the write (step S133). Next, the memory control unit 41 determines whether the write is set for the second data (step S134). When the write is set for the second data (step S134, Yes), the write processing is terminated.

On the other hand, when the write is set for the second data (step S134, No), the memory control unit 41 performs verify reading (step S135). Thereafter, the memory control unit 41 proceeds to the processing in step S132.

[Another Configuration of Image Processing Device]

Figure 6:
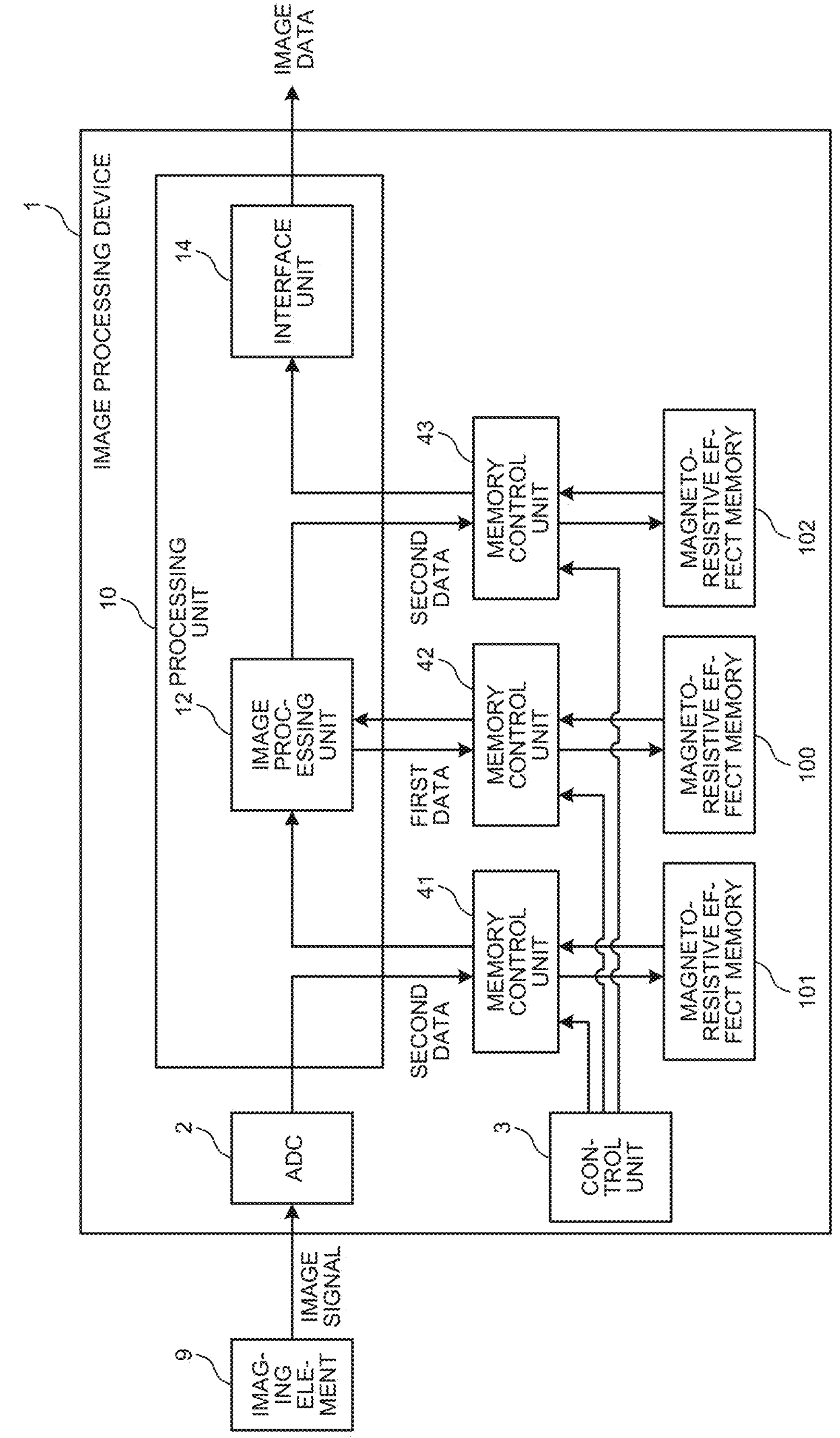
FIG. 6 is a diagram illustrating another configuration example of the image processing device according to the first embodiment of the present disclosure.

FIG. 6 is a diagram illustrating another configuration example of the image processing device according to the first embodiment of the present disclosure. The drawing is a diagram illustrating a configuration example of the image processing device 1, similarly to FIG. 4. The image processing device 1 in the drawing is different from the image processing device 1 in FIG. 4 in further including magnetoresistive effect memories 101 and 102 and omitting the frame memory control unit 11 and the image-data control unit 13 of the processing unit 10.

The magnetoresistive effect memories 101 and 102 hold the second data. In addition, the magnetoresistive effect memory 100 in the drawing holds the first data.

The ADC 2 in the drawing writes the image signal into the magnetoresistive effect memory 101 through the memory control unit 41. In addition, the image processing unit 12 in the drawing reads the frame from the magnetoresistive effect memory 101 through the memory control unit 41. In addition, the image processing unit 12 in the drawing writes the image data into the magnetoresistive effect memory 100 through the memory control unit 43. In addition, the interface unit 14 in the drawing reads the image data from the magnetoresistive effect memory 100 through the memory control unit 43.

[Modification of Image Processing Device]

Figure 7:
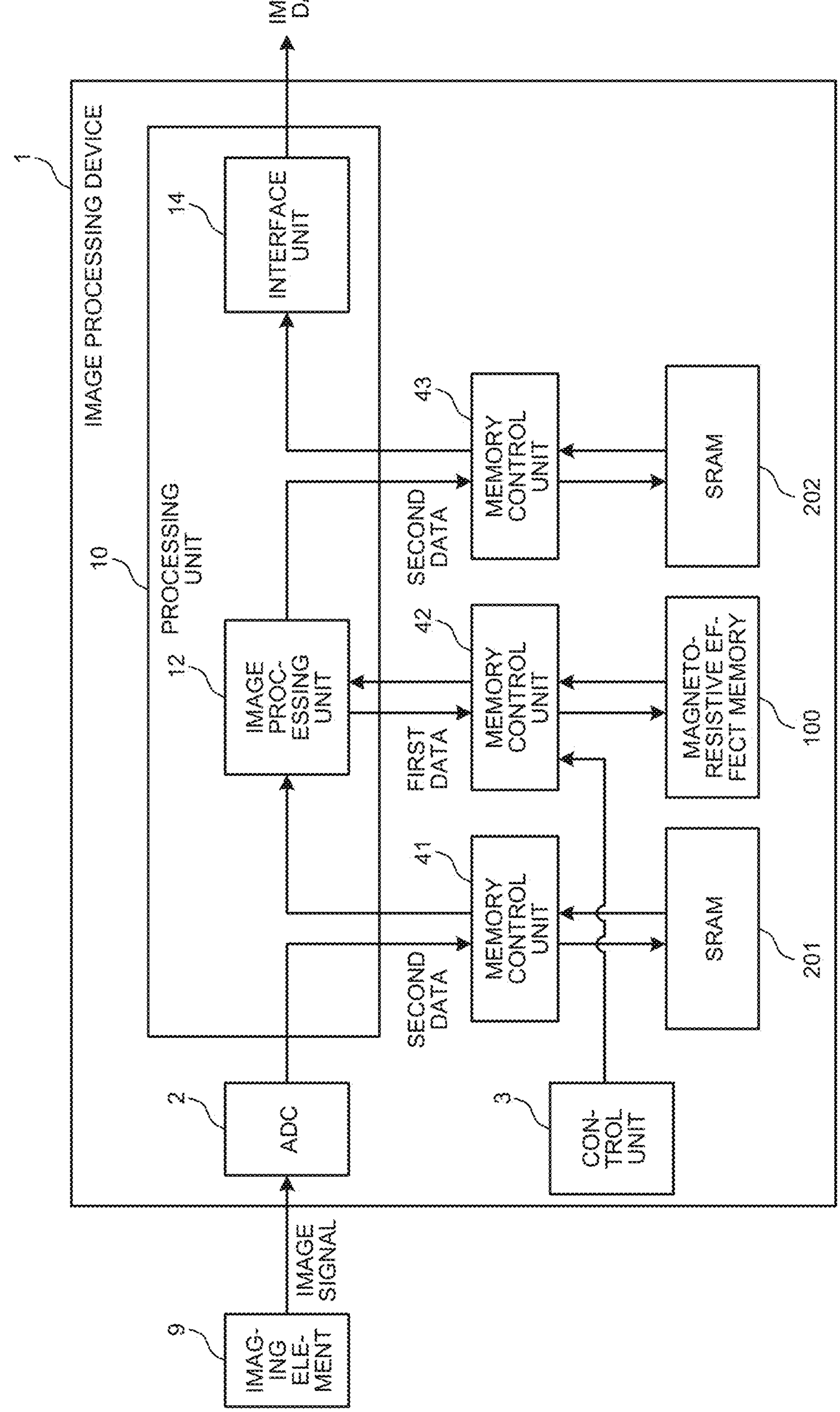
FIG. 7 is a diagram illustrating a configuration example of an image processing device according to a modification of the first embodiment of the present disclosure.
Figure 8:
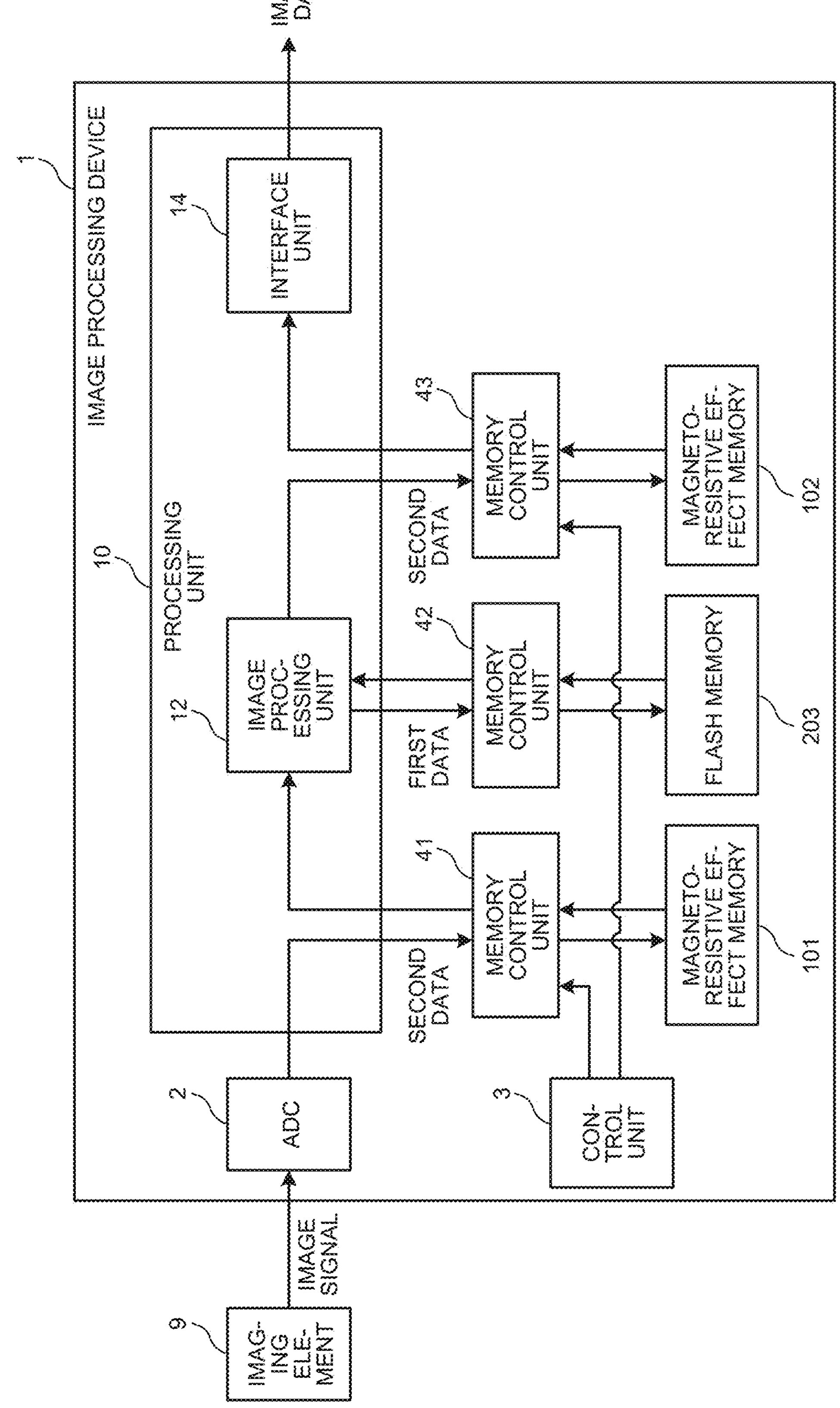
FIG. 8 is a diagram illustrating a configuration example of an image processing device according to a modification of the first embodiment of the present disclosure.

FIGS. 7 and 8 are diagrams illustrating configuration examples of an image processing device according to a modification of the first embodiment of the present disclosure. FIGS. 7 and 8 are diagrams illustrating configuration examples of the image processing device 1, similarly to FIG. 6. The image processing device 1 in FIG. 7 is different from the image processing device 1 in FIG. 6 in including SRAMs 201 and 202 instead of the magnetoresistive effect memories 101 and 102. The image processing device 1 in FIG. 8 is different from the image processing device 1 in FIG. 6 in including a flash memory 203 instead of the magnetoresistive effect memory 100.

Other configurations of the image processing device 1 are similar to those of the image processing device 1 in FIG. 6, and thus, description thereof is omitted.

As described above, the image processing device 1 according to the first embodiment of the present disclosure includes the voltage-controlled magnetoresistive effect memory 100 and the like to hold the first data and the second data. Since data having different properties is held in the magnetoresistive effect memory 100, it is possible to simplify the configuration of the image processing device 1.

2. Second Embodiment

In the above-described first embodiment, the technique in the present disclosure is applied to the image processing device 1. In contrast, a second embodiment of the present disclosure is different from the above-described first embodiment in applying the technique to an artificial intelligence functional chip.

[Configuration of Artificial Intelligence Functional Chip]

Figure 9:
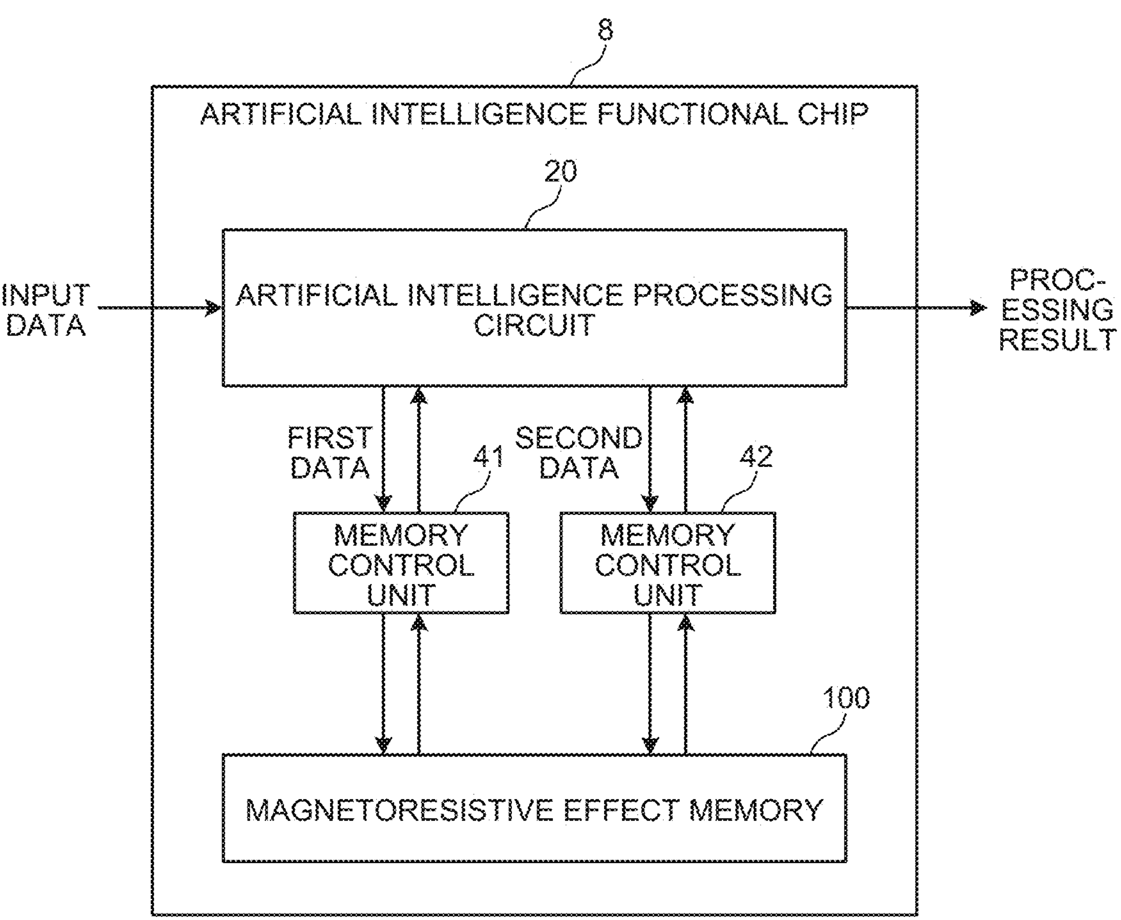
FIG. 9 is a diagram illustrating a configuration example of an artificial intelligence functional chip according to a second embodiment of the present disclosure.

FIG. 9 is a diagram illustrating a configuration example of an artificial intelligence functional chip according to the second embodiment of the present disclosure. The drawing is a block diagram illustrating a configuration example of an artificial intelligence functional chip 8. The artificial intelligence functional chip 8 is a semiconductor chip having an artificial intelligence (AI) function. The artificial intelligence functional chip 8 in the drawing includes an artificial intelligence processing circuit 20, a magnetoresistive effect memory 100, and memory control units 41 and 42.

The artificial intelligence processing circuit 20 is a circuit that performs processing for machine learning. The artificial intelligence processing circuit 20 in the drawing performs machine learning based on input data, and holds the learning result in the magnetoresistive effect memory 100. In addition, the artificial intelligence processing circuit 20 holds the operation result of the machine learning in the magnetoresistive effect memory 100 as temporary storage data. The learning result of the machine learning corresponds to first data, and the temporary storage data corresponds to second data.

Specifically, when data is input to the artificial intelligence processing circuit 20, the artificial intelligence processing circuit 20 reads training data from the magnetoresistive effect memory 100. Then, the artificial intelligence processing circuit 20 performs artificial intelligence processing, such as a product-sum operation of the input data and the training data. At that time, the artificial intelligence processing circuit 20 writes the operation intermediate result in the magnetoresistive effect memory 100 as the temporary storage data. The artificial intelligence processing circuit 20 repeats the operation of the training data and the operation intermediate result a predetermined number of times according to the number of networks and the number of layers in the artificial intelligence processing. When the predetermined number of times is reached, the artificial intelligence processing circuit 20 terminates the processing and outputs the result.

The memory control unit 41 that writes the first data can perform the write processing in step S100 in FIG. 2. In addition, the memory control unit 42 that writes the second data can perform the write processing in step S110 in FIG. 3.

[Another Configuration of Artificial Intelligence Functional Chip]

Figure 10:
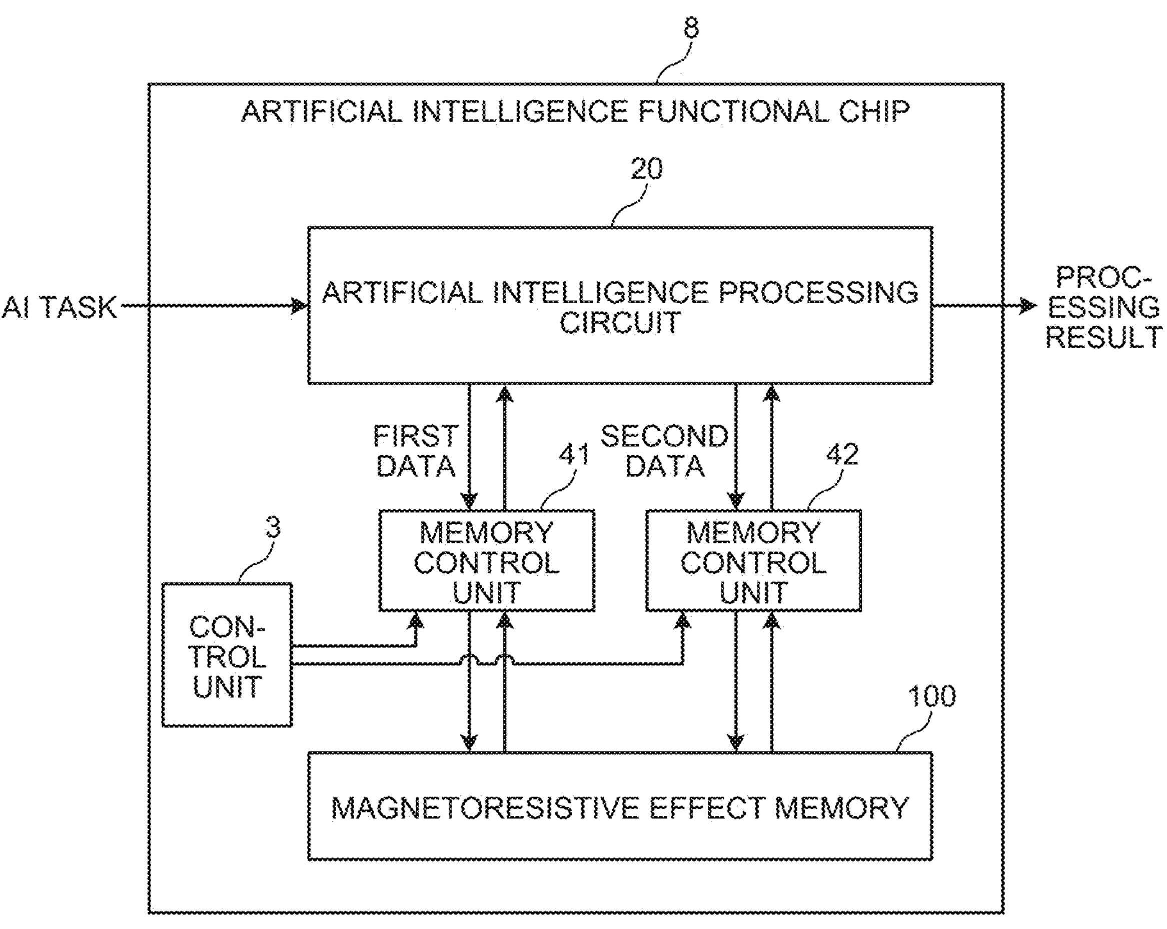
FIG. 10 is a diagram illustrating another configuration example of the artificial intelligence functional chip according to the second embodiment of the present disclosure.

FIG. 10 is a diagram illustrating another configuration example of the artificial intelligence functional chip according to the second embodiment of the present disclosure. The drawing is a block diagram illustrating a configuration example of the artificial intelligence functional chip 8, similarly to FIG. 9. The artificial intelligence functional chip 8 in the drawing is different from the artificial intelligence functional chip 8 in FIG. 9 in further including the control unit 3 described in FIG. 4. Note that the write processing in step S130 in FIG. 5 can be applied to the memory control units 41 and 42 in the drawing.

[Modification of Artificial Intelligence Functional Chip]

Figure 11:
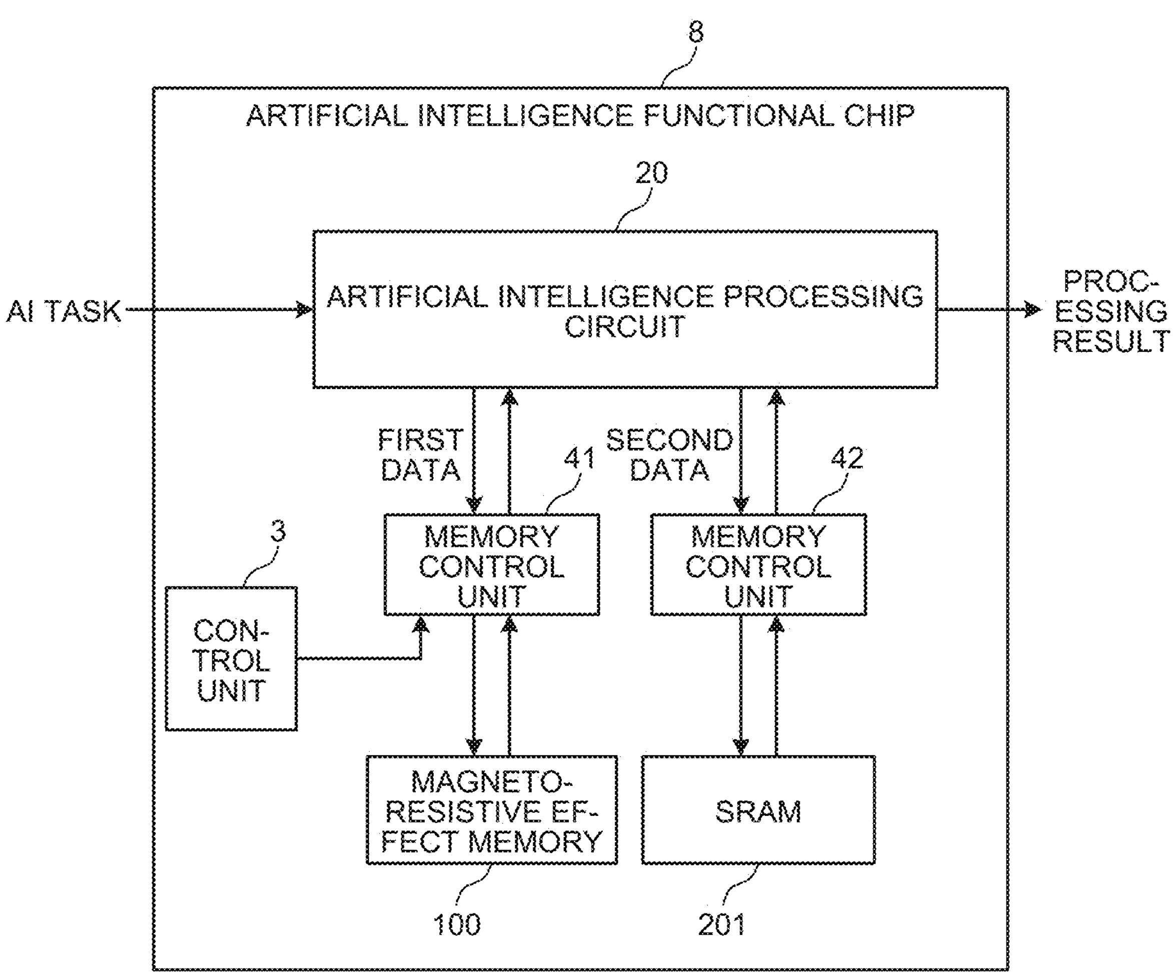
FIG. 11 is a diagram illustrating a configuration example of an artificial intelligence functional chip according to a modification of the second embodiment of the present disclosure.
Figure 12:
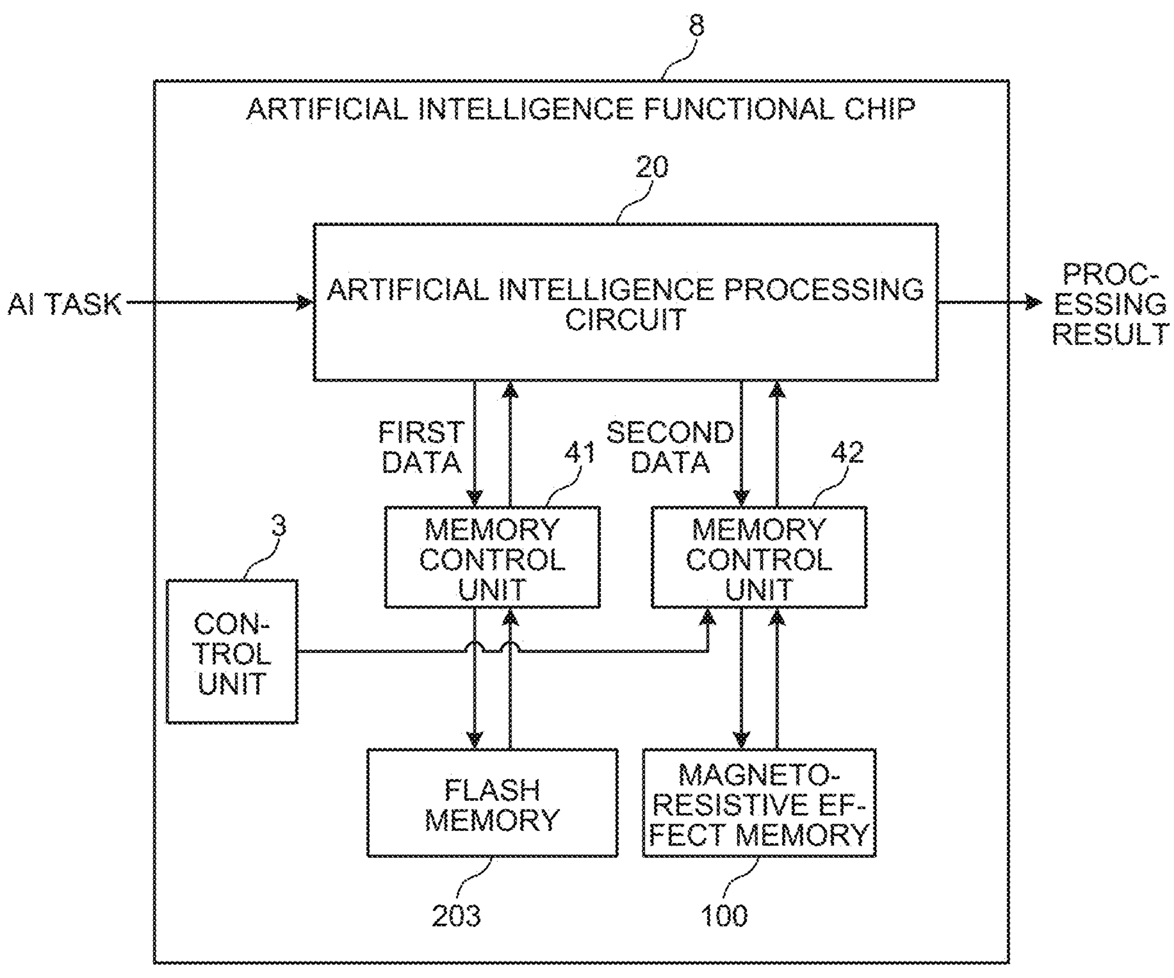
FIG. 12 is a diagram illustrating a configuration example of an artificial intelligence functional chip according to a modification of the second embodiment of the present disclosure.

FIGS. 11 and 12 are diagrams illustrating configuration examples of an artificial intelligence functional chip according to a modification of the second embodiment of the present disclosure. FIGS. 11 and 12 are diagrams illustrating configuration examples of the artificial intelligence functional chip 8, similarly to FIG. 10. The artificial intelligence functional chip 8 in FIG. 11 includes the magnetoresistive effect memory 100 and an SRAM 201. The SRAM 201 is controlled by the memory control unit 42 and holds the second data. Note that the magnetoresistive effect memory 100 in the drawing is controlled by the memory control unit 41 and holds the first data.

The artificial intelligence functional chip 8 in FIG. 12 includes a flash memory 203 and the magnetoresistive effect memory 100. The flash memory 203 is controlled by the memory control unit 41 and holds the first data. Note that the magnetoresistive effect memory 100 in the drawing is controlled by the memory control unit 42 and holds the second data.

Other configurations of the artificial intelligence functional chip 8 are similar to those of the artificial intelligence functional chip 8 in FIG. 10, and thus the description thereof is omitted.

As described above, the artificial intelligence functional chip 8 according to the second embodiment of the present disclosure includes the magnetoresistive effect memory 100 and the like to hold the first data and the second data. Since data having different properties is held in the magnetoresistive effect memory 100, it is possible to simplify the configuration of the image processing device 1.

3. Third Embodiment

[Configuration of Microcontroller]

Figure 13:
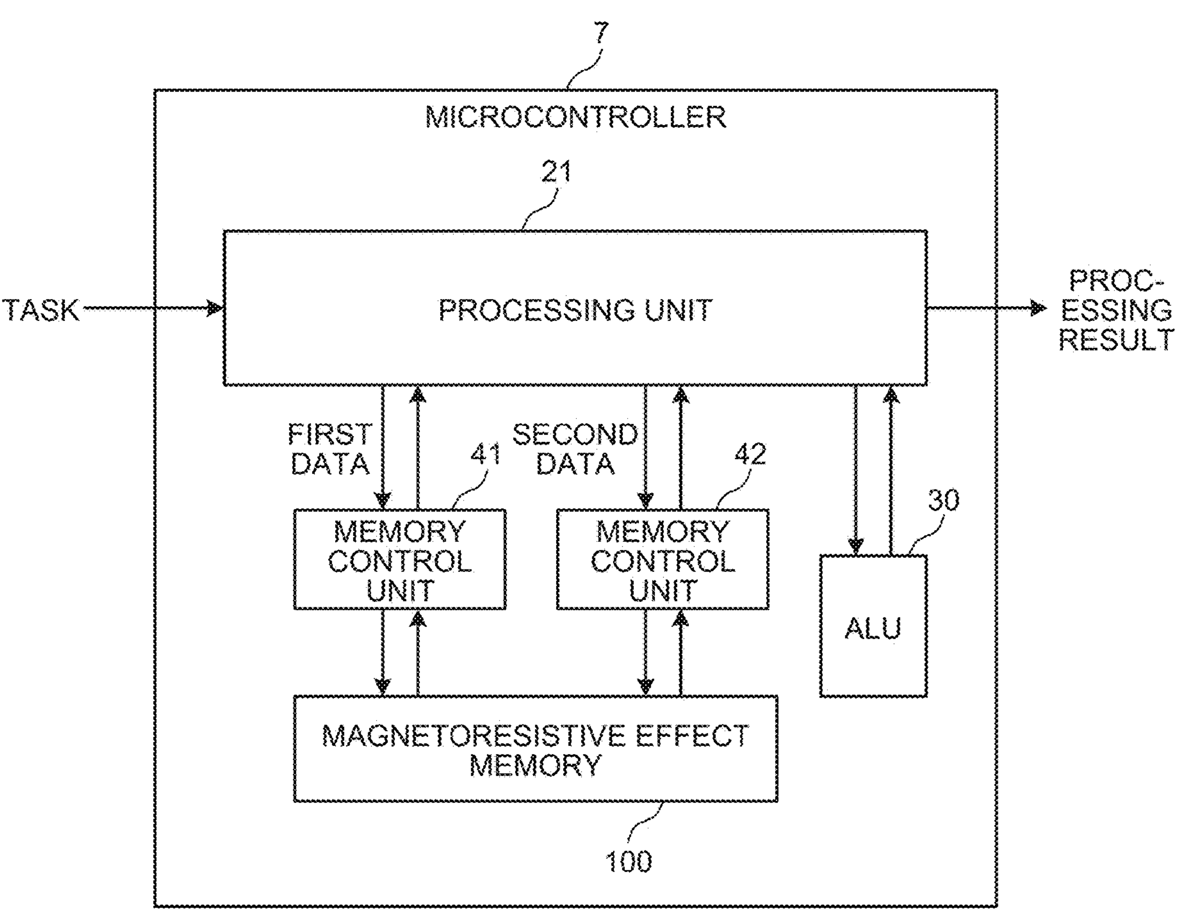
FIG. 13 is a diagram illustrating a configuration example of a microcontroller according to a third embodiment of the present disclosure.

FIG. 13 is a diagram illustrating a configuration example of a microcontroller according to a third embodiment of the present disclosure. The drawing is a block diagram illustrating a configuration example of a microcontroller 7. The microcontroller 7 includes a processing unit 21, an ALU 30, a magnetoresistive effect memory 100, and memory control units 41 and 42.

The processing unit 21 performs processing using a program held in the magnetoresistive effect memory 100. In addition, the processing unit 21 holds work data, which is operation data in the processing, in the magnetoresistive effect memory 100. This program corresponds to first data, and the work data corresponds to second data. Note that the ALU 30 is a circuit that performs an arithmetic operation.

The memory control unit 41 that writes the first data can perform the write processing in step S100 in FIG. 2. In addition, the memory control unit 42 that writes the second data can perform the write processing in step S110 in FIG. 3.

Note that a DSP similar to the microcontroller 7 can be configured. In the case of a DSP, a DSP core is disposed instead of the processing unit 21. The magnetoresistive effect memory 100 holds the program and the work data. Note that the ALU 30 can be omitted in the DSP.

[Configuration of CPU]

Figure 14:
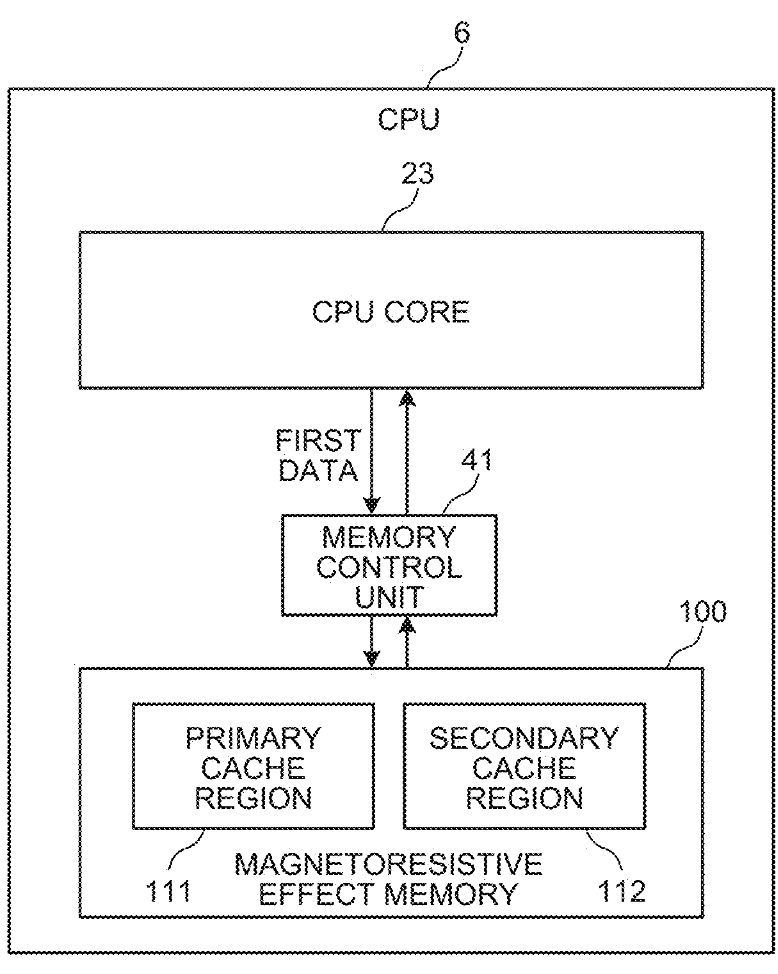
FIG. 14 is a diagram illustrating a configuration example of a CPU according to the third embodiment of the present disclosure.

FIG. 14 is a diagram illustrating a configuration example of a CPU according to the third embodiment of the present disclosure. The drawing is a block diagram illustrating a configuration example of a CPU 6. The CPU 6 in the drawing includes a CPU core 23, the magnetoresistive effect memory 100, and the memory control unit 41. The magnetoresistive effect memory 100 in the drawing includes a primary cache region 111 and a secondary cache region 112. The primary cache region 111 and the secondary cache region 112 have different allowable access delays.

4. Fourth Embodiment

In the above-described first embodiment, the technique in the present disclosure is applied to the image processing device 1. In contrast, a fourth embodiment of the present disclosure is different from the above-described first embodiment in applying the technique to a baseband processing chip.

[Configuration of Baseband Processing Chip]

Figure 15:
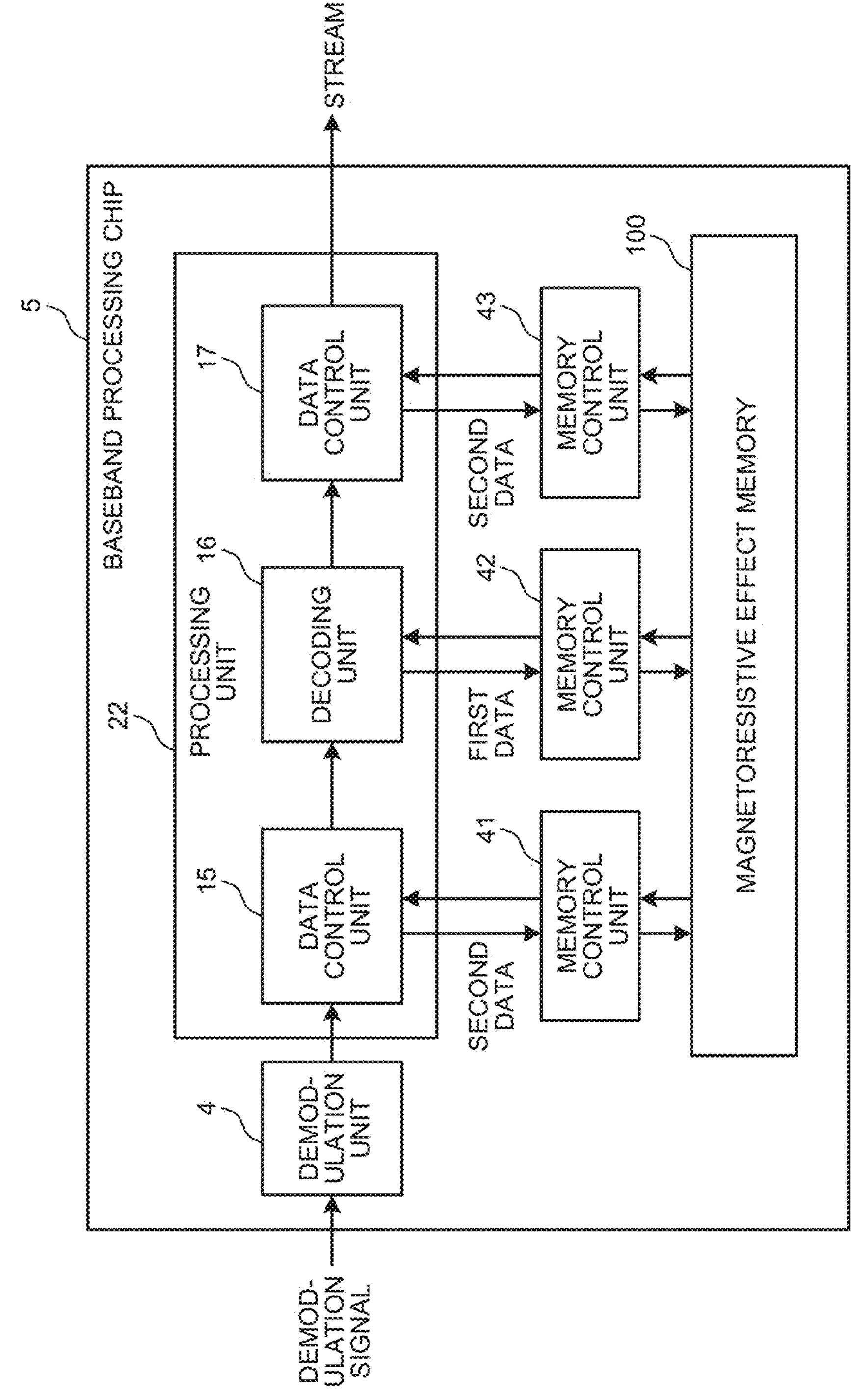
FIG. 15 is a diagram illustrating a configuration example of a baseband processing chip according to a fourth embodiment of the present disclosure.

FIG. 15 is a diagram illustrating a configuration example of a baseband processing chip according to the fourth embodiment of the present disclosure. The drawing is a block diagram illustrating a configuration example of a baseband processing chip 5. The baseband processing chip 5 is a semiconductor chip that performs baseband processing for communication control. The baseband processing chip 5 in the drawing includes a demodulation unit 4, a processing unit 22, a magnetoresistive effect memory 100, and memory control units 41 to 43.

The demodulation unit 4 demodulates a modulation signal. The demodulated signal is input to the processing unit 22.

The processing unit 22 includes data control units 15 and 17 and a decoding unit 16. The data control unit 15 performs processing for rearranging interleaved data. The intermediate data during rearrangement is temporarily held in the magnetoresistive effect memory 100.

The decoding unit 16 decodes data. The decoding unit 16 performs decoding using, for example, a Forward Error Correction (FEC) decoding algorism or the like. The decoding unit 16 reads the optimum value of communication channel information from the magnetoresistive effect memory 100 for each processing.

The data control unit 17 holds the decoded data. The data control unit 17 holds, for example, a decoded stream in the magnetoresistive effect memory 100.

The intermediate data of the data control unit 15 and the stream of the data control unit 17 correspond to second data, and the communication channel information of the decoding unit 16 corresponds to first data.

The memory control unit 42 that writes the first data can perform the write processing in step S100 in FIG. 2. In addition, the memory control units 41 and 43 that write the second data can perform the write processing in step S110 in FIG. 3.

As described above, the baseband processing chip 5 according to the fourth embodiment of the present disclosure includes the magnetoresistive effect memory 100 and the like to hold the first data and the second data. Since data having different properties is held in the magnetoresistive effect memory 100, it is possible to simplify the configuration of the baseband processing chip 5.

5. Fifth Embodiment

The electronic device according to the above-described embodiments holds the first data and the second data in the magnetoresistive effect memory 100. In contrast, an electronic device according to a fifth embodiment of the present disclosure is different from the above-described embodiments in using a magnetoresistive effect memory 100 including a region for holding first data and second data.

[Configuration of Artificial Intelligence Functional Chip]

Figure 16:
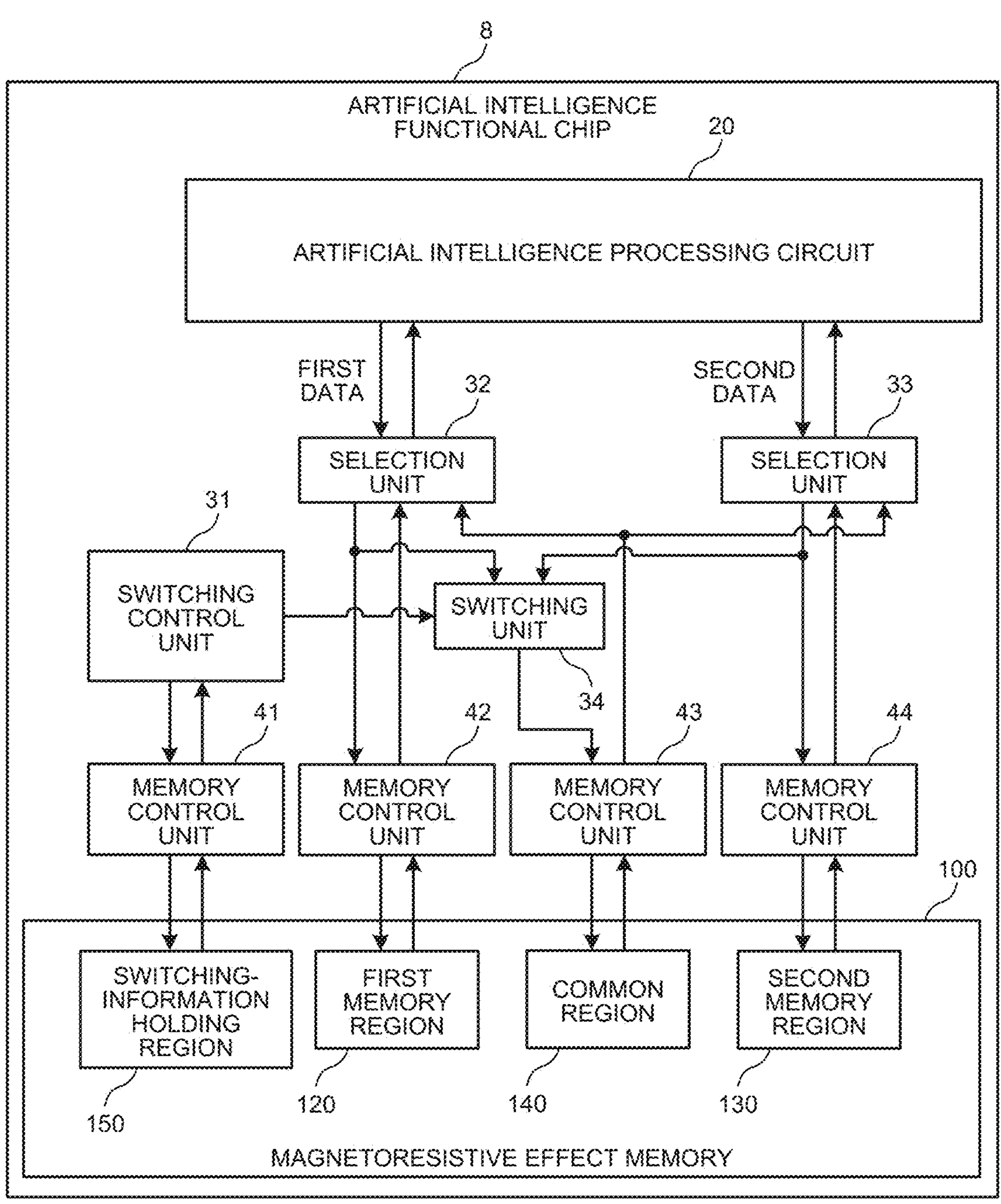
FIG. 16 is a diagram illustrating a configuration example of an artificial intelligence functional chip according to a fifth embodiment of the present disclosure.

FIG. 16 is a diagram illustrating a configuration example of an artificial intelligence functional chip according to the fifth embodiment of the present disclosure. The drawing is a block diagram illustrating a configuration example of the artificial intelligence functional chip 8, similarly to FIG. 9. The magnetoresistive effect memory 100 according to the fifth embodiment of the present disclosure is described using the artificial intelligence functional chip 8 in the drawing.

The artificial intelligence functional chip 8 in the drawing includes an artificial intelligence processing circuit 20, a magnetoresistive effect memory 100, memory control units 41 to 44, selection units 32 and 33, a switching unit 34, and a switching control unit 31.

The magnetoresistive effect memory 100 in the drawing includes a first memory region 120, a second memory region 130, a common region 140, and a switching-information holding region 150.

The first memory region 120 is a region in which the first data is held. The second memory region 130 is a region in which the second data is held. The common region 140 is a region in which either the first data or the second data is held. The switching-information holding region 150 is a region in which switching information for switching the common region 140 to either holding the first data or holding the second data is held.

The memory control unit 41 handles the switching-information holding region 150. The memory control unit 42 handles the first memory region 120. The memory control unit 43 handles the common region 140. The memory control unit 44 handles the second memory region 130. The memory control unit 42 that writes the first data can perform the write processing in step S100 in FIG. 2. In addition, the memory control unit 44 that writes the second data can perform the write processing in step S110 in FIG. 3. In addition, the memory control unit 43 can perform either processing in step S100 in FIG. 2 or step S110 in FIG. 3 based on the switching information.

The switching unit 34 performs control to switch between the first data and the second data and write the data into the common region 140. This switching is controlled by the switching control unit 31.

The switching control unit 31 controls the switching between the first data and the second data in the switching unit 34. The switching control unit 31 controls the switching unit 34 based on the switching information held in the switching-information holding region 150.

The selection unit 32 selects the first data among the data read from the common region 140 and outputs the first data to the artificial intelligence processing circuit 20. In addition, the selection unit 32 further writes the first data from the artificial intelligence processing circuit 20 into the first memory region 120 through the memory control unit 42.

The selection unit 33 selects the second data among the data read from the common region 140 and outputs the second data to the artificial intelligence processing circuit 20. In addition, the selection unit 33 further writes the second data from the artificial intelligence processing circuit 20 in the second memory region 130 through the memory control unit 44.

These selection units 32 and 33 perform selection based on the control of the switching control unit 31.

As described above, by disposing the common region 140 in the magnetoresistive effect memory 100 to hold either the first data or the second data, it is possible to adjust the ratio of the holding regions of the first data and the second data in the magnetoresistive effect memory 100. Note that a configuration including a plurality of common regions 140 can also be employed.

Note that the switching information may be held in a memory other than the magnetoresistive effect memory 100, for example, an eFuse memory.

[Start Processing]

Figure 17A:
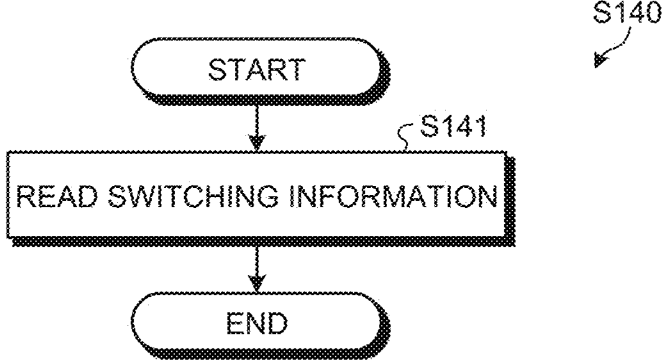
FIG. 17A is a diagram illustrating an example of a processing procedure of start processing according to the fifth embodiment of the present disclosure.

FIG. 17A is a diagram illustrating an example of a processing procedure of start processing according to the fifth embodiment of the present disclosure. The start processing is terminated when the switching control unit 31 reads the switching information from the switching-information holding region 150 of the magnetoresistive effect memory 100 (step S141).

[Training Data Update Processing]

Figure 17B:
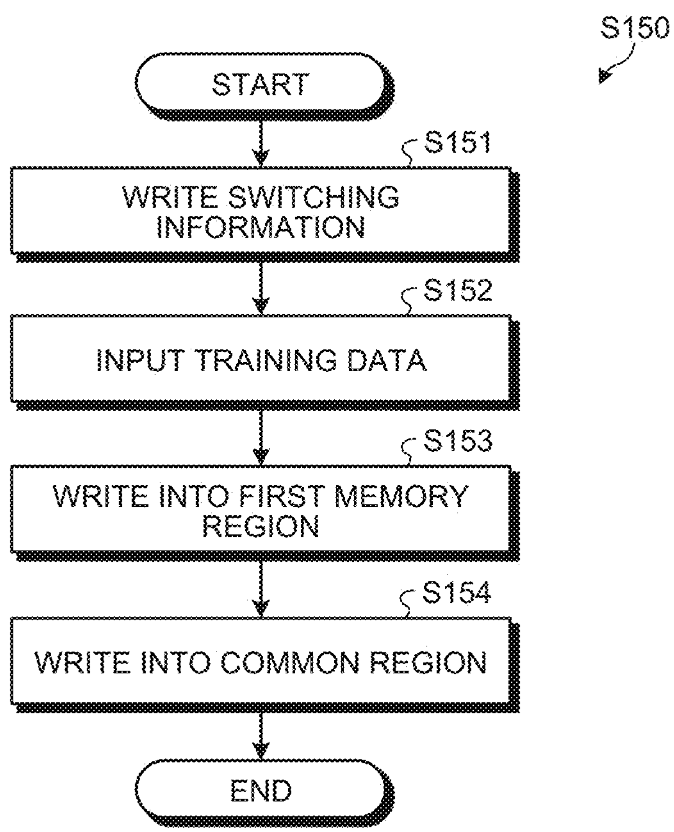
FIG. 17B is a diagram illustrating an example of a processing procedure of training data update processing according to the fifth embodiment of the present disclosure.

FIG. 17B is a diagram illustrating an example of a processing procedure of training data update processing according to the fifth embodiment of the present disclosure. The drawing is a diagram illustrating an example when the first data is written into the common region 140. First, the switching control unit 31 writes the switching information into the switching-information holding region 150 (step S151). Next, the artificial intelligence processing circuit 20 outputs the training data to the selection unit 32 (step S152). Next, the selection unit 32 writes the training data into the first memory region 120 through the memory control unit 42 (step S153). Next, the selection unit 32 writes the training data into the common region 140 through the memory control unit 43 (step S154).

[Another Configuration of Artificial Intelligence Functional Chip]

Figure 18:
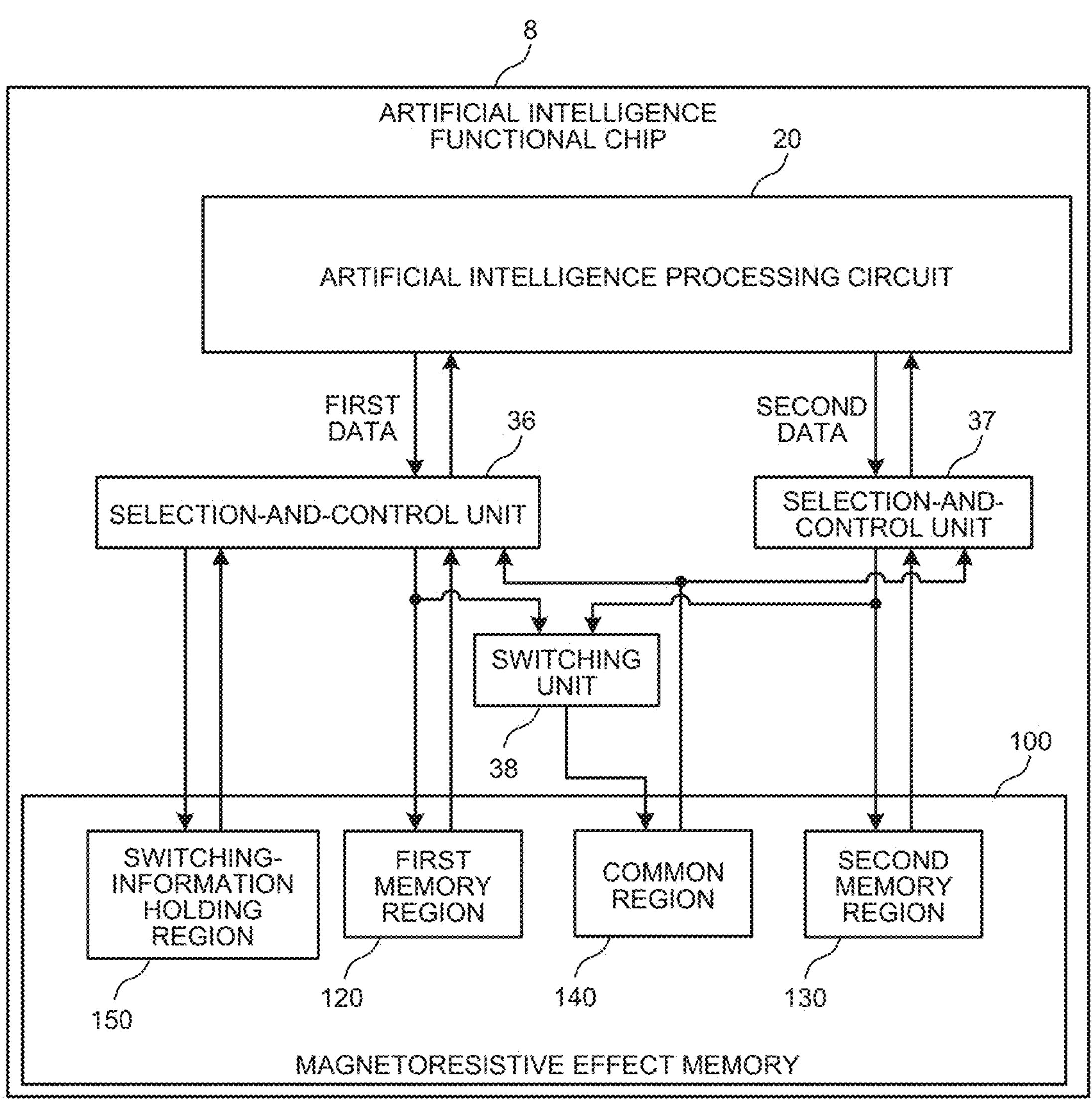
FIG. 18 is a diagram illustrating another configuration example of the artificial intelligence functional chip according to the fifth embodiment of the present disclosure.

FIG. 18 is a diagram illustrating another configuration example of the artificial intelligence functional chip according to the fifth embodiment of the present disclosure. The drawing is a block diagram illustrating a configuration example of the artificial intelligence functional chip 8, similarly to FIG. 16. In the artificial intelligence functional chip 8 in the drawing, the memory control units 41 to 44 are omitted. In addition, the artificial intelligence functional chip 8 in the drawing is different from the artificial intelligence functional chip 8 in FIG. 16 in disposing selection-and-control units 36 and 37 instead of the selection units 32 and 33 and disposing a switching unit 38 instead of the switching unit 34.

The switching unit 38 performs control to switch between the first data and the second data and write the data in the common region 140. In addition, the switching unit 38 further performs processing for the write into the common region 140.

The selection-and-control unit 36 selects the first data among the data read from the common region 140 and outputs the first data to the artificial intelligence processing circuit 20. In addition, the selection-and-control unit 36 further performs processing for the write into and reading from the first memory region 120. In addition, the selection-and-control unit 36 further performs processing for writing and reading the switching information into and from the switching-information holding region 150. Note that the selection-and-control unit 36 performs selection based on the switching information.

The selection-and-control unit 37 selects the second data among the data read from the common region 140 and outputs the second data to the artificial intelligence processing circuit 20. In addition, the selection-and-control unit 37 further performs processing for the write into and reading from the second memory region 130. Note that the selection-and-control unit 37 performs selection based on the switching information.

The selection-and-control unit 36 that writes the first data can perform the write processing in step S100 in FIG. 2. In addition, the selection-and-control unit 37 that writes the second data can perform the write processing in step S110 in FIG. 3.

In the artificial intelligence functional chip 8 in FIG. 16, the memory control unit is disposed for each region of the magnetoresistive effect memory 100, but the artificial intelligence functional chip 8 in the drawing employs a configuration in which a control circuit is provided for each type of data. In addition, since the switching information is written at the time of updating the training data, it is possible to employ a configuration in which the switching control is performed by the selection-and-control unit 36. Note that a configuration including a plurality of common regions 140 can also be employed.

Other configurations of the artificial intelligence functional chip 8 are similar to those of the artificial intelligence functional chip 8 according to the second embodiment of the present disclosure, and thus the description thereof is omitted.

As described above, in the artificial intelligence functional chip 8 according to the fifth embodiment of the present disclosure, the common region 140 is disposed in the magnetoresistive effect memory 100 to hold either the first data or the second data. Therefore, it is possible to adjust the ratio of the holding regions of the first data and the second data in the magnetoresistive effect memory 100.

6. Sixth Embodiment

In the artificial intelligence functional chip 8 in the above-described fifth embodiment, the first memory region 120, the second memory region 130, and the common region 140 are disposed in the magnetoresistive effect memory 100 to hold the first data and the second data. In contrast, an artificial intelligence functional chip 8 in a sixth embodiment of the present disclosure is different from the above-described fifth embodiment in further holding redundant data for error detection and correction in a magnetoresistive effect memory 100.

[Configuration of Artificial Intelligence Functional Chip]

Figure 19:
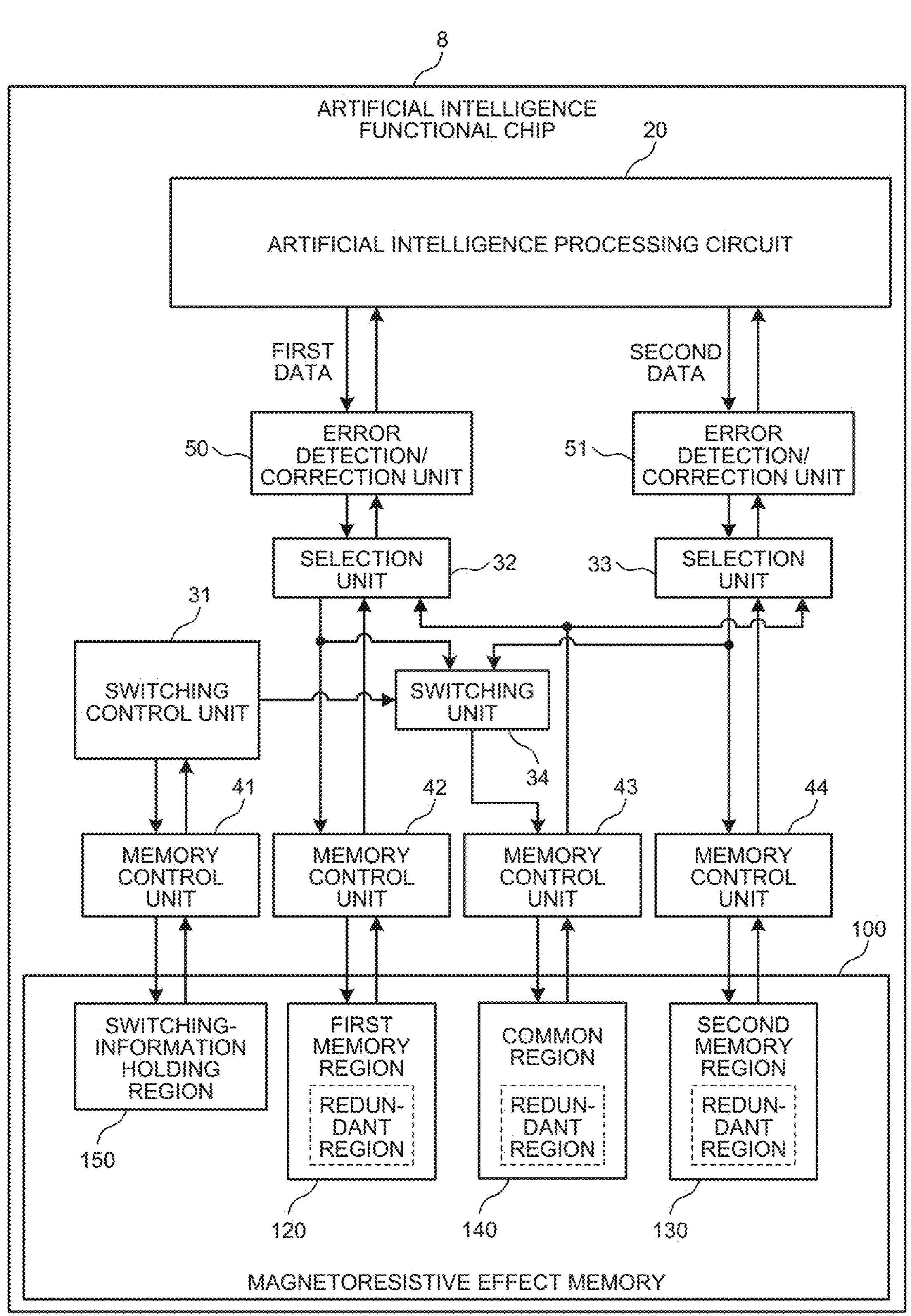
FIG. 19 is a diagram illustrating a configuration example of an artificial intelligence functional chip according to a sixth embodiment of the present disclosure.

FIG. 19 is a diagram illustrating a configuration example of an artificial intelligence functional chip according to the sixth embodiment of the present disclosure. The drawing is a block diagram illustrating a configuration example of the artificial intelligence functional chip 8, similarly to FIG. 16. The artificial intelligence functional chip 8 in the drawing is different from the artificial intelligence functional chip 8 in FIG. 16 in further including error detection/correction units 50 and 51.

The error detection/correction unit 50 performs error detection and correction coding (ECC) and decoding of first data. The error detection/correction unit 51 performs error correction coding ECC and decoding of second data. Note that the number of correctable bits of the error detection/correction unit 50 and the number of correctable bits of the error detection/correction unit 51 may be different. For example, the number of error correction bits for the second data may be smaller than the number of error correction bits for the first data.

A redundant region is disposed in the first memory region 120 in the drawing. This redundant region is a region for holding redundant data generated by the error detection/correction unit 50. In addition, a redundant region is also disposed in the second memory region 130 in the drawing. This redundant region is a region for holding redundant data generated by the error detection/correction unit 51. When the number of correctable bits of the error detection/correction unit 50 and the number of correctable bits of the error detection/correction unit 51 are different, the sizes of the redundant regions may be different.

[Another Configuration of Artificial Intelligence Functional Chip]

Figure 20:
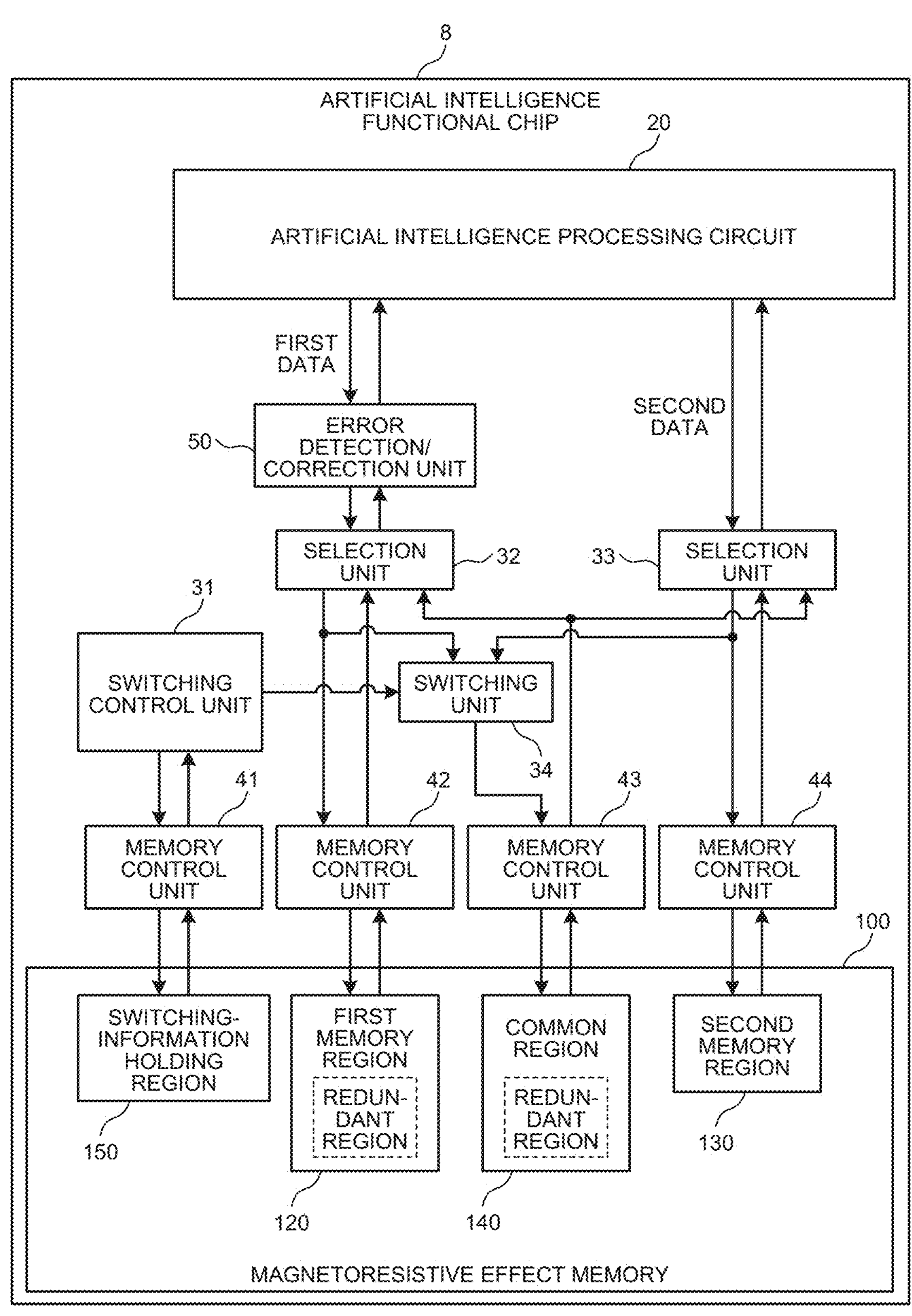
FIG. 20 is a diagram illustrating another configuration example of the artificial intelligence functional chip according to the sixth embodiment of the present disclosure.

FIG. 20 is a diagram illustrating another configuration example of the artificial intelligence functional chip according to the sixth embodiment of the present disclosure. The drawing is a block diagram illustrating a configuration example of the artificial intelligence functional chip 8, similarly to FIG. 19. The artificial intelligence functional chip 8 in the drawing is different from the artificial intelligence functional chip 8 in FIG. 19 in omitting the error detection/correction unit 51.

Other configurations of the artificial intelligence functional chip 8 are similar to those of the artificial intelligence functional chip 8 according to the fifth embodiment of the present disclosure, and thus the description thereof is omitted.

As described above, the artificial intelligence functional chip 8 according to the sixth embodiment of the present disclosure includes the error detection/correction units 50 and 51 to reduce errors in the write data in the magnetoresistive effect memory 100.

7. Seventh Embodiment

In the artificial intelligence functional chip 8 in the above-described fifth embodiment, the memory control units 42 and 44 are individually disposed for the first data and the second data. In contrast, an artificial intelligence functional chip 8 according to a seventh embodiment of the present disclosure is different from the above-described fifth embodiment in that first data and second data are commonly accessed.

[Configuration of Artificial Intelligence Functional Chip]

Figure 21:
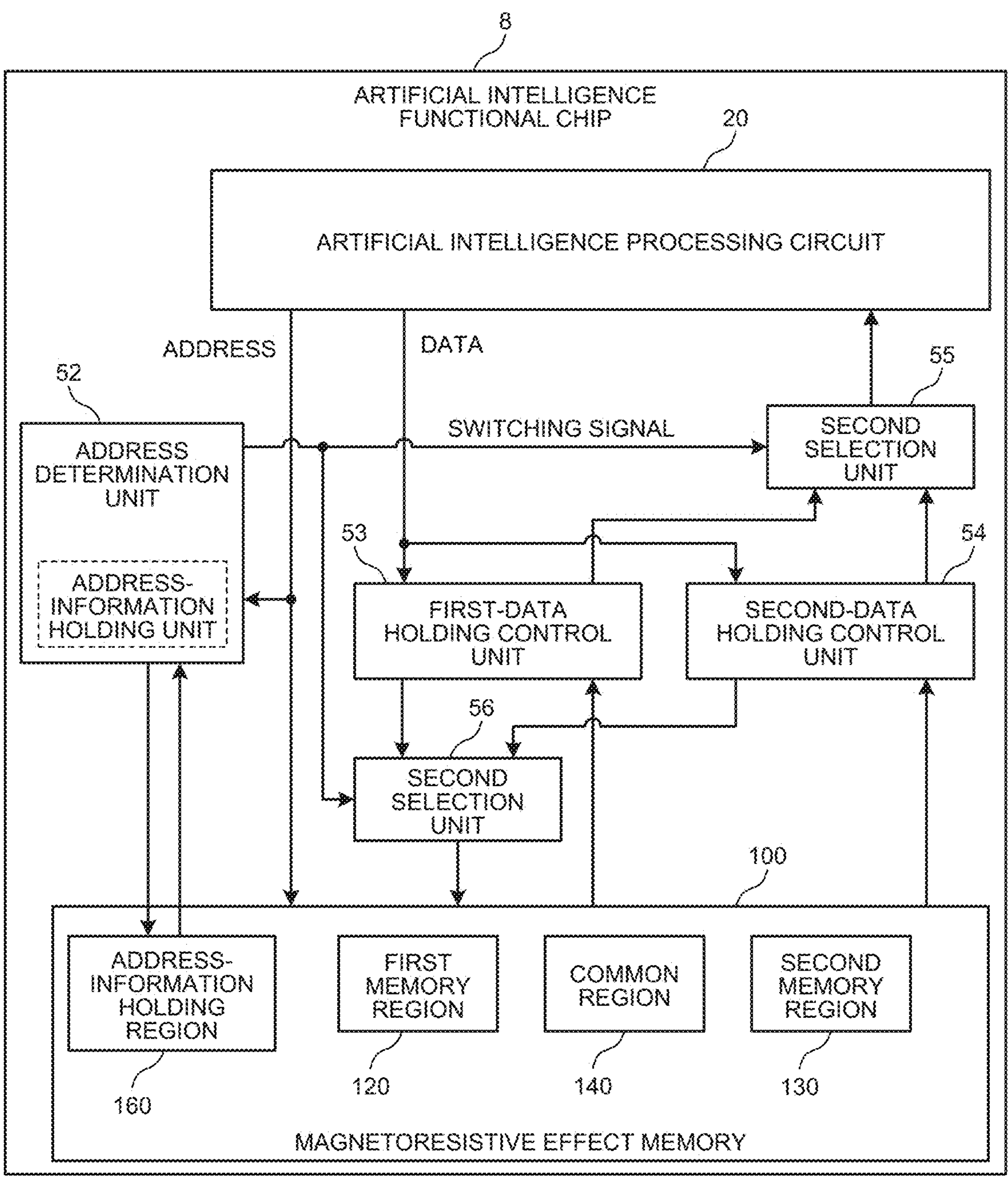
FIG. 21 is a diagram illustrating a configuration example of an artificial intelligence functional chip according to a seventh embodiment of the present disclosure.

FIG. 21 is a diagram illustrating a configuration example of an artificial intelligence functional chip according to the seventh embodiment of the present disclosure. The drawing is a block diagram illustrating a configuration example of the artificial intelligence functional chip 8, similarly to FIG. 16. The artificial intelligence functional chip 8 in the drawing is different from the artificial intelligence functional chip 8 in FIG. 16 in omitting the memory control units 41 to 44, the selection units 32 and 33, the switching unit 34, and the switching control unit 31. In addition, the artificial intelligence functional chip 8 in the drawing is different from the artificial intelligence functional chip 8 in FIG. 16 in including a first-data holding control unit 53, a second-data holding control unit 54, second selection units 55 and 56, and an address determination unit 52. In addition, in a magnetoresistive effect memory 100 in the drawing, an address-information holding region 160 is disposed instead of the switching-information holding region 150.

An artificial intelligence processing circuit 20 in the drawing outputs an address when accessing the magnetoresistive effect memory 100.

The address-information holding region 160 is a region for holding address information. This address information is information of addresses of the first data and the second data held in a first memory region 120, a second memory region 130, and a common region 140.

The address determination unit 52 determines, based on the address information, whether the address output from the artificial intelligence processing circuit 20 is the first data and the second data related to the first memory region 120, the second memory region 130, and the common region 140. The address determination unit 52 generates a switching signal based on the determination result and outputs the switching signal to the second selection units 55 and 56. In addition, the address determination unit 52 writes the address information into the above-described address-information holding region 160. In addition, the address determination unit 52 further reads the address information from the address-information holding region 160. Note that the address determination unit 52 is an example of a second switching control unit described in the claims.

The first-data holding control unit 53 performs control to write the data from the artificial intelligence processing circuit 20 as the first data. The first-data holding control unit 53 performs the write processing in step S100 in FIG. 2. In addition, the first-data holding control unit 53 further reads the first data from the magnetoresistive effect memory 100.

The second-data holding control unit 54 performs control to write the data from the artificial intelligence processing circuit 20 as the second data. The second-data holding control unit 54 performs the write processing in step S110 in FIG. 3. In addition, the second-data holding control unit 54 further reads the second data from the magnetoresistive effect memory 100.

The second selection unit 55 selects the first-data holding control unit 53 or the second-data holding control unit 54 based on the switching signal and outputs the read data to the artificial intelligence processing circuit 20.

The second selection unit 56 selects the first-data holding control unit 53 or the second-data holding control unit 54 based on the switching signal and outputs the write data to the magnetoresistive effect memory 100.

[Address Determination Processing]

Figure 22:
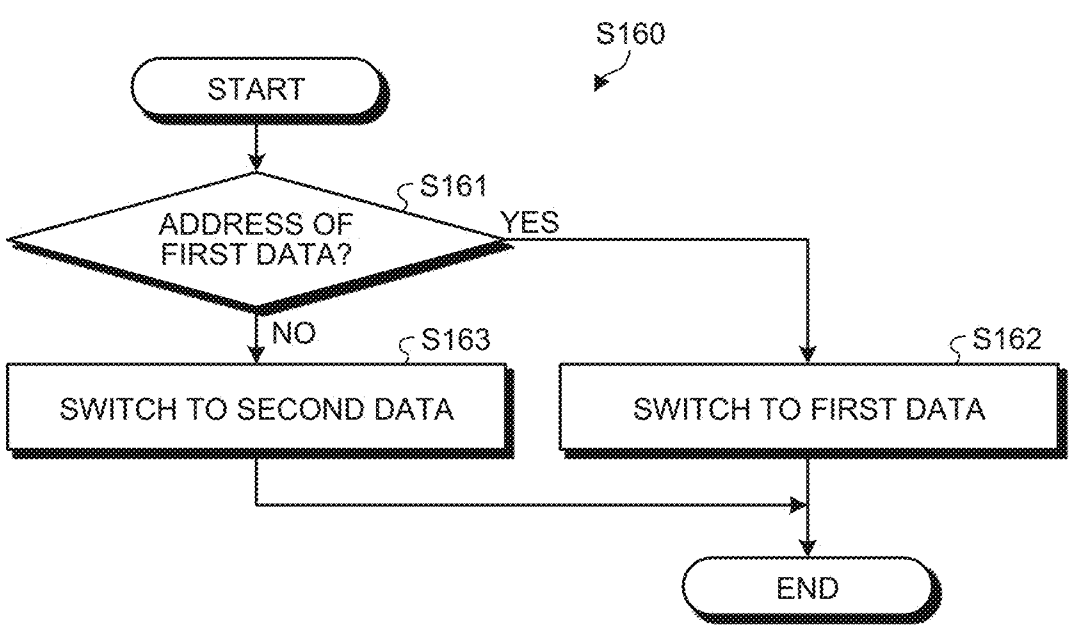
FIG. 22 is a diagram illustrating an example of a processing procedure of address determination processing according to the seventh embodiment of the present disclosure.

FIG. 22 is a diagram illustrating an example of a processing procedure of address determination processing according to the seventh embodiment of the present disclosure. The drawing is a flowchart illustrating an example of determination processing in the address determination unit 52. First, the address determination unit 52 determines, based on the address information, whether the address from the artificial intelligence processing circuit 20 is the address of the first data (step S161). As the result, when the address is the address of the first data (step S161, Yes), processing for switching to the first data is performed (step S162), and the switching signal is output. On the other hand, when the address is not the address of the first data (step S161, No), processing for switching to the second data is performed (step S163), and the switching signal is output.

Other configurations of the artificial intelligence functional chip 8 are similar to those of the artificial intelligence functional chip 8 according to the fifth embodiment of the present disclosure, and thus the description thereof is omitted.

As described above, in the artificial intelligence functional chip 8 according to the seventh embodiment of the present disclosure, it is possible to omit the memory control unit 41 and the like and simplify the configuration of the artificial intelligence functional chip 8.

8. Eighth Embodiment

In the artificial intelligence functional chip 8 in the above-described seventh embodiment, the first-data holding control unit 53 and the second-data holding control unit 54 access the first data and the second data. In contrast, an artificial intelligence functional chip 8 according to the seventh embodiment of the present disclosure is different from the above-described seventh embodiment in integrating the first-data holding control unit 53 and the second-data holding control unit 54.

[Configuration of Artificial Intelligence Functional Chip]

Figure 23:
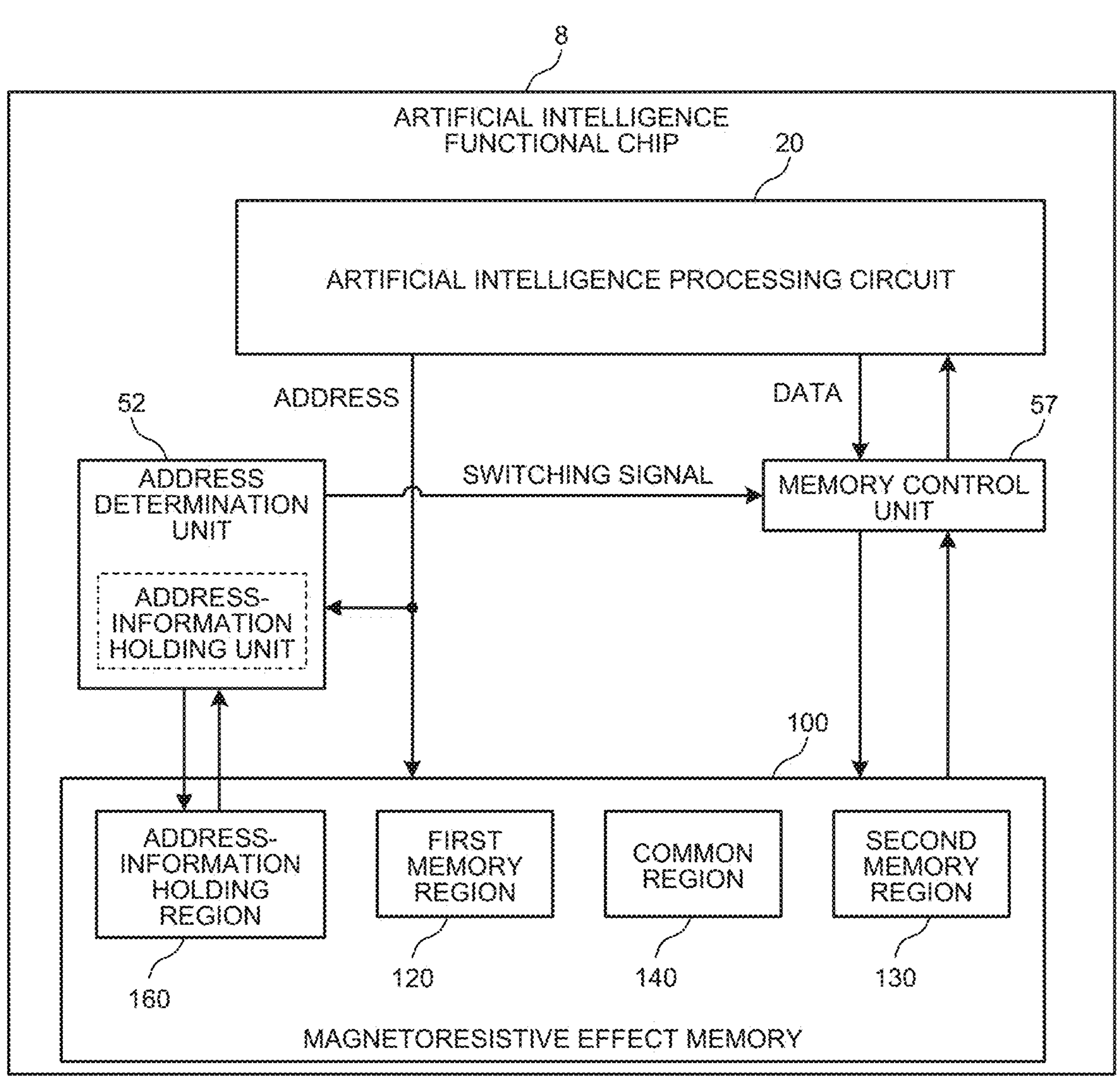
FIG. 23 is a diagram illustrating a configuration example of an artificial intelligence functional chip according to an eighth embodiment of the present disclosure.

FIG. 23 is a diagram illustrating a configuration example of an artificial intelligence functional chip according to the eighth embodiment of the present disclosure. The drawing is a block diagram illustrating a configuration example of the artificial intelligence functional chip 8, similarly to FIG. 21. The artificial intelligence functional chip 8 in the drawing is different from the artificial intelligence functional chip 8 in FIG. 21 in disposing a memory control unit 57 instead of the first-data holding control unit 53, the second-data holding control unit 54, and the second selection units 55 and 56.

The memory control unit 57 is a control unit that collectively performs a control procedure for the first data and the second data.

[Write Processing]

Figure 24:
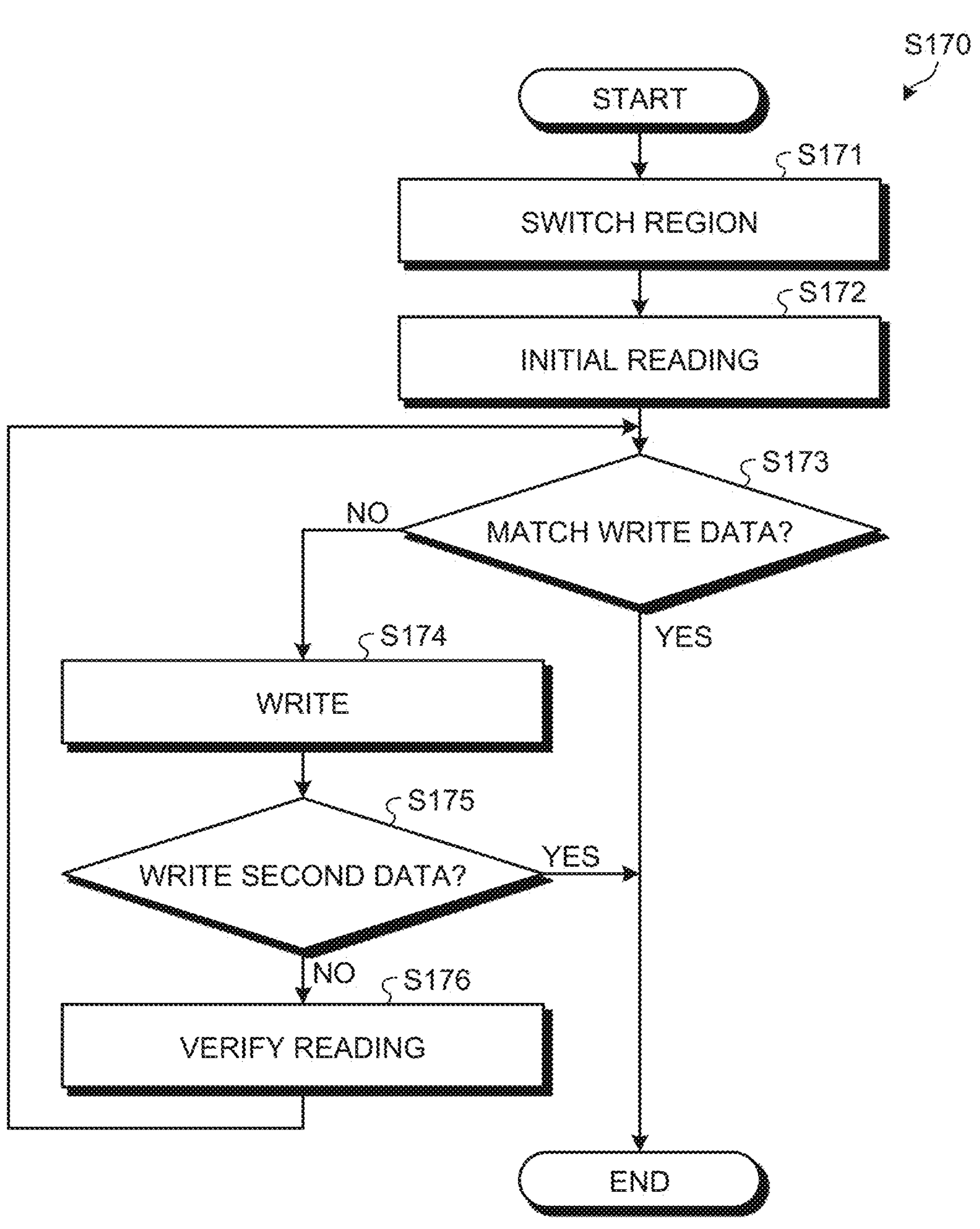
FIG. 24 is a diagram illustrating an example of a processing procedure of write processing according to the eighth embodiment of the present disclosure.

FIG. 24 is a diagram illustrating an example of a processing procedure of write processing according to the eighth embodiment of the present disclosure. First, the memory control unit 57 switches a region based on address information (step S171). Next, the memory control unit 57 performs initial reading (step S172). Next, the memory control unit 57 determines whether the data read in step S172 matches the write data (step S173). As the result, when they are matched (step S173, Yes), the write processing is terminated.

On the other hand, when they are not matched (step S173, No), the memory control unit 57 performs the write (step S174). Next, the memory control unit 57 determines whether the write data is the second data (step S175). This can be performed based on the region switched in step S171. As the result, when the write data is the second data (step S175, Yes), the processing is terminated. On the other hand, when the write data is not the second data (step S175, No), the memory control unit 57 performs verify reading (step S176). Thereafter, the memory control unit 57 proceeds to the processing in step S173.

[Another Configuration of Artificial Intelligence Functional Chip]

Figure 25:
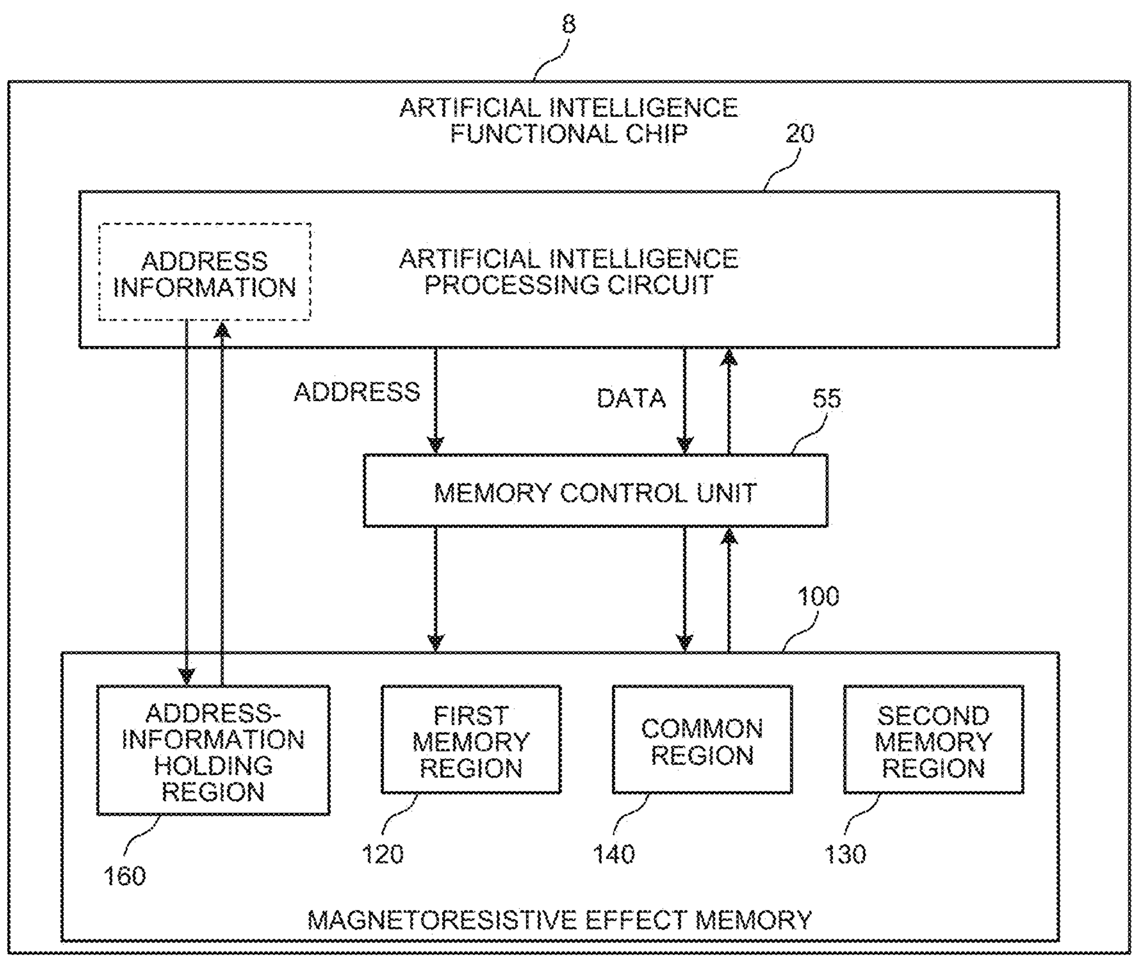
FIG. 25 is a diagram illustrating another configuration example of the artificial intelligence functional chip according to the eighth embodiment of the present disclosure.

FIG. 25 is a diagram illustrating another configuration example of the artificial intelligence functional chip according to the eighth embodiment of the present disclosure. The drawing is a block diagram illustrating a configuration example of the artificial intelligence functional chip 8, similarly to FIG. 23. The artificial intelligence functional chip 8 in the drawing is different from the artificial intelligence functional chip 8 in FIG. 23 in omitting the address determination unit 52.

The artificial intelligence processing circuit 20 in the drawing reads the address information from the address-information holding region 160 and holds the address information. The artificial intelligence processing circuit 20 in the drawing controls the memory control unit 57 based on the held address information.

Other configurations of the artificial intelligence functional chip 8 are similar to those of the artificial intelligence functional chip 8 according to the seventh embodiment of the present disclosure, and thus the description thereof is omitted.

As described above, the artificial intelligence functional chip 8 according to the eighth embodiment of the present disclosure can further simplify the configuration of the artificial intelligence functional chip 8.

Note that the effects described in the present specification are merely examples and are not limited, and other effects may be provided.

Note that the present technique can also have the following configurations.

(1)

An electronic device comprising:

a magnetoresistive effect memory configured to hold first data to be written for long-term holding and second data to be written for short-term holding;

a memory control unit configured to write the first data and the second data into the magnetoresistive effect memory and to verify the first data; and a processing unit configured to perform processing based on the first data and the second data.

(2)

The electronic device according to the above (1), wherein the write for long-term holding is a write with verification, and the write for short-term holding is a write without verification.

(3)

The electronic device according to the above (1), wherein the second data is an image signal, the first data is a set value in processing of the image signal, and the processing unit performs processing of the second data based on the first data.

(4)

The electronic device according to the above (3), wherein the magnetoresistive effect memory further holds a program for processing the second data.

(5)

The electronic device according to the above (1), wherein the first data is a machine learning result in an artificial intelligence processing circuit, the second data is temporary storage data during machine learning, and the processing unit performs the machine learning using the second data to generate the first data.

(6)

The electronic device according to the above (1), wherein the second data is a processing result in baseband processing, the first data is a set value in the baseband processing, and the processing unit performs the baseband processing based on the first data to generate the second data.

(7)

The electronic device according to the above (1), wherein the first data is a program, the second data is operation data, and the processing unit processes the second data with the first data.

(8)

The electronic device according to the above (1), wherein the magnetoresistive effect memory includes a first memory region being a region for holding the first data, and a second memory region being a region for holding the second data.

(9)

The electronic device according to the above (8), wherein the magnetoresistive effect memory further includes a common region being a region for holding either the first data or the second data.

(10)

The electronic device according to (9), wherein the magnetoresistive effect memory further includes a switching-information holding region for holding switching information for switching the common region to either holding the first data or holding the second data.

(11)

The electronic device according to the above (10), further comprising:

a switching control unit configured to control a write into the common region based on the switching information; and a selection unit configured to select data read from the common region based on the switching information.

(12)

The electronic device according to the above (11), further comprising:

a first error detection/correction unit configured to perform error detection/correction processing of the first data, wherein the first memory region further includes a redundant region for holding redundant data about an error correction code generated by the first error detection/correction unit.

(13)

The electronic device according to the above (12), further comprising:

a second error detection/correction unit configured to perform error detection/correction processing of the second data, wherein the second memory region further includes a redundant region for holding redundant data about an error correction code generated by the second error detection/correction unit.

(14)

The electronic device according to (9), wherein the magnetoresistive effect memory further includes an address-information holding region for holding address information being information of addresses of the first data and the second data held in the common region.

(15)

The electronic device according to the above (14), further comprising a second switching control unit configured to switch the common region to either holding the first data or holding the second data based on the address information.

REFERENCE SIGNS LIST

1 IMAGE PROCESSING DEVICE
5 BASEBAND PROCESSING CHIP
6 CPU
7 MICROCONTROLLER
8 ARTIFICIAL INTELLIGENCE FUNCTIONAL CHIP
10 PROCESSING UNIT
11 FRAME MEMORY CONTROL UNIT
20 ARTIFICIAL INTELLIGENCE PROCESSING CIRCUIT
21 PROCESSING UNIT
31 SWITCHING CONTROL UNIT
32, 33 SELECTION UNIT
34, 38 SWITCHING UNIT
36, 37 SELECTION-AND-CONTROL UNIT
41 to 44, 57 MEMORY CONTROL UNIT
50, 51 ERROR DETECTION/CORRECTION UNIT
52 ADDRESS DETERMINATION UNIT
53 FIRST-DATA HOLDING CONTROL UNIT
54 SECOND-DATA HOLDING CONTROL UNIT
55, 56 SECOND SELECTION UNIT
100 MAGNETORESISTIVE EFFECT MEMORY
120 FIRST MEMORY REGION
130 SECOND MEMORY REGION
140 COMMON REGION
150 SWITCHING-INFORMATION HOLDING REGION
160 ADDRESS-INFORMATION HOLDING REGION

The invention claimed is:

1. An electronic device, comprising:

a magnetoresistive effect memory configured to hold first data and second data, wherein the magnetoresistive effect memory includes a common region to hold one of the first data or the second data; and circuitry configured to:

write the first data and the second data into the magnetoresistive effect memory, wherein the first data is written for a first time period and the second data is written for a second time period, and the first time period is longer than the second time period;

verify the written first data;

read switching information from the magnetoresistive effect memory;

control a switching operation between the first data and the second data for the common region based on the switching information;

write the one of the first data or the second data in the common region based on the switching operation;

select the one of the first data or the second data from the common region; and execute a processing operation based on the selected one of the first data or the second data.

2. The electronic device according to claim 1, wherein the first data is written for the first time period with the verification of the first data, and the second data is written for the second time period without verification of the second data.

3. The electronic device according to claim 1, wherein the second data is an image signal, the first data is a set value in the processing operation of the image signal, and the circuitry is further configured to execute the processing operation of the second data based on the first data.

4. The electronic device according to claim 3, wherein the magnetoresistive effect memory is further configured to hold a program for the processing operation of the second data.

5. The electronic device according to claim 1, wherein the first data is a machine learning result in an artificial intelligence processing circuit, the second data is temporary storage data in a machine learning process, and the circuitry is further configured to execute the machine learning process based on the second data, to generate the first data.

6. The electronic device according to claim 1, wherein the second data is a processing result in a baseband process, the first data is a set value in the baseband process, and the circuitry is further configured to execute the baseband process based on the first data, to generate the second data.

7. The electronic device according to claim 1, wherein the first data is a program, the second data is operation data, and the circuitry is further configured to process the second data with the first data.

8. The electronic device according to claim 1, wherein the magnetoresistive effect memory further includes:

a first memory region to hold the first data; and a second memory region to hold the second data.

9. The electronic device according to claim 8, wherein the magnetoresistive effect memory further includes a switching-information holding region to hold the switching information.

10. The electronic device according to claim 9, wherein the circuitry is further configured to;

execute a first error detection process and a first error correction process of the first data; and generate a first error correction code based on the first error detection process and the first error correction process, and the first memory region includes a redundant region to hold first redundant data of the first error correction code.

11. The electronic device according to claim 10, wherein the circuitry is further configured to:

execute a second error detection process and a second error correction process of the second data; and generate a second error correction code based on the second error detection process and the second error correction process, and the second memory region includes a redundant region to hold second redundant data of the second error correction code.

12. The electronic device according to claim 8, wherein the magnetoresistive effect memory further includes an address-information holding region to hold address information, and the address information includes addresses of the first data and the second data held in the common region.

13. The electronic device according to claim 12, wherein the circuitry is further configured to switch the common region to hold the one of the first data or the second data, and the common region is switched based on the address information.

* * * * *